(12) United States Patent
Sekiguchi et al.

(10) Patent No.: US 8,729,532 B2
(45) Date of Patent: May 20, 2014

(54) LIGHT-ABSORBING MATERIAL AND PHOTOELECTRIC CONVERSION ELEMENT

(75) Inventors: Takashi Sekiguchi, Suita (JP); Hiroyuki Nishide, Tokyo (JP); Michio Suzuka, Shijonawate (JP); Takeyuki Yamaki, Nara (JP); Kenichi Oyaizu, Tokyo (JP); Fumiaki Kato, Tokyo (JP); Shingo Kambe, Hirakata (JP); Satoko Kambe, legal representative, Hirakata (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 213 days.

(21) Appl. No.: 13/322,048

(22) PCT Filed: May 21, 2010

(86) PCT No.: PCT/JP2010/058662
§ 371 (c)(1),
(2), (4) Date: Mar. 28, 2012

(87) PCT Pub. No.: WO2010/134607
PCT Pub. Date: Nov. 25, 2010

(65) Prior Publication Data
US 2012/0181516 A1   Jul. 19, 2012

(30) Foreign Application Priority Data
May 22, 2009 (JP) .................. 2009-124522

(51) Int. Cl.
*H01L 51/46* (2006.01)
*C07D 333/24* (2006.01)
*C07D 401/14* (2006.01)
*H01L 51/54* (2006.01)
*C07D 209/94* (2006.01)

(52) U.S. Cl.
USPC .............. 257/40; 257/E51.026; 257/E51.002; 548/449; 546/187; 549/77

(58) Field of Classification Search
None
See application file for complete search history.

(56) References Cited

U.S. PATENT DOCUMENTS

2003/0062080 A1   4/2003   Satoh et al.

FOREIGN PATENT DOCUMENTS

| JP | 2664194 B2 | 10/1997 |
| JP | 2003-100360 A | 4/2003 |
| JP | 3687736 B2 | 8/2005 |
| JP | 2007-262263 A | 10/2007 |

(Continued)

OTHER PUBLICATIONS

Shultz et al., "Preparation of meso-Tetra(4-galvinolphenyl) porphyrin—A Building Block for Molecular Magnetic Materials," Tetrahedron Lett., vol. 34, No. 25, pp. 3975-3978, 1993.*

(Continued)

*Primary Examiner* — Ling Choi
*Assistant Examiner* — Catherine S Branch
(74) *Attorney, Agent, or Firm* — McDermott Will & Emery LLP

(57) ABSTRACT

The present invention provides a light-absorbing material capable of providing high photoelectric conversion efficiency when applied to a photoelectric conversion element.
The light-absorbing material of the present invention has a structure represented by Formula (1) below:

$$X-Y \quad (1)$$

(wherein X represents a light-absorbing site, and Y represents a radical site that becomes a radical when in an oxidized state and/or when in a reduced state, and is capable of repeated oxidation-reduction).

4 Claims, 23 Drawing Sheets

(56) References Cited

FOREIGN PATENT DOCUMENTS

| | | |
|---|---|---|
| JP | 4080288 B2 | 4/2008 |
| JP | 2008-201912 A | 9/2008 |
| JP | 2008-280400 A | 11/2008 |
| JP | 2009-21212 A | 1/2009 |
| JP | 2009-032547 A | 2/2009 |
| JP | 2009-81141 A | 4/2009 |

OTHER PUBLICATIONS

International Search Report for the Application No. PCT/JP2010/058662 mailed Aug. 17, 2010.

Mod, Yukie et al., "Spin Effects on Decay Dynamics of Charge-Separated States Generated by Photoinduced Electron Transfer in Zinc Porphyrin-Naphthalenediimide Dyads", J. Phys. Chem. A., 2002, vol. 106, pp. 4453-4467.

Rakowsky, Margaret H., et al., "Time-Domain Electron Paramagnetic Resonance as a Probe of Electron-Electron Spin-Spin Interaction in Spin-Labeled Low-Spin Iron Porphyrins", J. Am. Chem. Soc., 1995, vol. 117, pp. 2049-2057.

Huang, Jian-Ying et al., "TEMPO-Linked Metalloporphyrins as Efficient Catalysts for Selective Oxidation of Alcohols and Sulfides", Tetrahedron Letters, 2006, vol. 47, pp. 5637-5640.

Rakowsky, Margaret H., et al., "Determination of High-Spin Iron(III)-Nitroxyl Distances in Spin-Labeled Porphyrins by Time-Domain EPR", Journal of Magnetic Resonance, 1998, vol. 131, pp. 97-110.

Eaton, Sandra S., et al., "Metal-Nitroxyl Interactions. 29, EPR Studies of Spin-Labeled Copper Complexes in Frozen Solution", Journal of Magnetic Resonance, 1983, vol. 52, pp. 435-449.

More, Kundaiika M., et al., "Determination of $T_1$ and $T_2$ by Simulation of EPR Power Saturation Curves and Saturated Spectra. Application to Spin-Labeled Iron Porphyrins", Journal of Magnetic Resonance, 1984, vol. 60, pp. 54-65.

Hata, Seiji et al., "On the Mobility of Spin-Labeled Hemin Coordinated to Polymer", Japanese Journal of Polymer Science and Technology, 1980, vol. 37, No. 10, pp. 635-640.

Head, Nicholas J., et al,, "Synthesis and Photophysical Studies of a Porphyrin-Viologen Dyad Covalently Linked by a Flexible Seven-Atom Chain", Journal of Photochemistry and Photobiology A: Chemistry, 2000, vol. 133, pp. 105-114.

Amao, Yutaka et al., "Photoinduced Hydrogen Production with the System Containing Water-Soluble Viologen-Linked Prophyrins and Hydrogenase", Journal of Molecular Catalysis B: Enzymatic, 2002, vol. 17, pp. 9-21.

Martinez-Junza, Victor et al., "Conformational and Photophysicai Studies on Porphyrin-Containing Donor-Bridge-Acceptor Compounds. Charge Separation in Micellar Nanoreactors", Physical Chemistry Chemical Physics, 2005, vol. 7, No. 24, pp. 4114-4125.

Lahav, Michel et al., "Photoelectrochemistry with Integrated Photosensitizer-Electron Acceptor and Au-Nanoparticle Arrays", J. Am. Chem. Soc., 2000, vol. 122, pp. 11480-11487,.

Levin, Peter P., et al., "Effects of Linking Chain Length and Magnetic Fieid on the Kinetics of Photoprocesses in Covalently Bonded Porphyrin-Viologen Dyads", Molecular Physics, 2002, vol. 100, No. 9, pp. 1459-1463.

Robertson, Neil et al. "Optimizing Dyes for Dye-Sensitized Solar Cells." Angew. Chem. Int. Ed. vol. 45, 2006, pp. 2338-2345.

\* cited by examiner

Molecular Weight: 356.46
(6)-2

(6)-3

| | | |
|---|---|---|
| (6)-2 | 10 mmol (3.56 g) | 1eq |
| DMF | 0.7 M (14.3 ml) | |
| Imidazole | 30 mmol (2.10g) | 3 eq |
| t-Butyldimethylsilile chrolide | 12.5 mol (1.88 g) | 1.25 eq | r.t., 10h

Evaporation

Extraction

Column

YIELD 80% TO 90%

YIELD 50% TO 60%

YIELD 95% TO 100%

Molecular Weight: 1106.6
(7)-4

(7)-d (7)-5

| | (7)-4 | 2 mmol (2.21 g) 1eq |
|---|---|---|
| | toluene | 0.3 M (6.7 ml) |
| | Pd$_2$(dba)$_3$ | 0.02 mol (18.0 mg) 0.01 eq |
| | NaO$t$-Bu | 3 mol (288 mg) 1.5 eq |
| | P($t$-Bu)$_3$ | 0.06 mol (12 mg) 0.03 eq |
| | 1,2,3,3a,4,8b-hexahydrocyclopenta[$b$]indole-7-carbaldehyde | |
| reflux, o.n. | | 3 mol (562 mg) 1.5 eq |

= Evaporation

= Extraction

= Column

YIELD 50% TO 60%

YIELD 80% TO 90%

Molecular Weight: 1279.9

TBAF : Tetrabutylammoniumfluoride

YIELD 95% TO 100%

Bis(4-bromophenyl)amine
Molecular Weight: 327.0
(8)-1

Molecular Weight: 343.5
(8)-2

| | | |
|---|---|---|
| Bis(4-bromophenyl)amine | 30 mmol (9.81 g) | 1eq |
| THF | 0.2 M (150 ml) | |
| t-BuLi | 0.27 mol (170 ml, d = 1.6 M) | 9 eq |
| 2-methyl-2-Nitrosopropane | 90 mmol (7.84 g) | 3 eq |

YIELD 40% TO 50%

LIGHT-ABSORBING MATERIAL AND PHOTOELECTRIC CONVERSION ELEMENT

TECHNICAL FIELD

The present invention relates to a light absorbing material for use in a solar cell or other photoelectric conversion elements, and to a photoelectric conversion element provided with this light-absorbing material.

BACKGROUND ART

Solar cells and other photoelectric conversion elements hold great promise as sources of clean energy, and p-n junction-type silicon solar cells are already in practical use. However, highly pure raw materials are required for manufacturing silicon solar cells, and vacuum processes and high-temperature processes at temperatures around 1000° C. are also required during preparation of silicon solar cells. Thus, reducing the manufacturing costs of photoelectric conversion elements has been a major issue.

Under these circumstances, recent attention has focused on wet solar cells, in which charge separation is accomplished by means of the potential gradient at a solid-liquid interface. The need for highly pure raw materials and high-energy processes is less with a wet solar cell than with a silicon solar cell.

In recent years in particular, there has been extensive research into so-called dye-sensitized solar cells, which comprise a semiconductor electrode supporting a sensitizing dye that absorbs light. In a dye-sensitized solar cell, the sensitizing dye absorbs visible light at wavelengths longer than the band gap of the semiconductor electrode, and the resulting photoexcited electrons are injected into the semiconductor electrode, improving the photoelectric conversion efficiency.

In a conventional dye-sensitized solar cell, only a single layer of sensitizing dye supported on the surface of the semiconductor electrode injects electrons into the semiconductor electrode. However, as described in Japanese Patent No. 2664194, Gratzel et al proposed that the area of interface between a photosensitizing dye and a titanium oxide electrode could be greatly increased by using a porous titanium oxide electrode as the semiconductor electrode, and supporting the photosensitizing dye on this titanium oxide electrode. The porous titanium oxide electrode is prepared by the sol-gel method. This titanium oxide electrode has a porosity of about 50%, and a porous structure with an extremely large actual surface area. If the titanium oxide electrode is 8 μm thick for example, the roughness factor of the electrode (ratio of actual surface area to projected area) is about 720. The amount of dye supported on this titanium oxide electrode reaches $1.2 \times 10^{-7}$ mol/cm$^2$ according to geometric calculation, and in fact about 98% of incident light is absorbed at the maximum absorption wavelength.

The primary features of this new kind of dye-sensitized solar cell (also called a Gratzel cell) are the use of a porous titanium oxide electrode to greatly increase the supported amount of sensitizing dye, and the development of a sensitizing dye providing high absorption efficiency of solar light and extremely rapid rates of electron injection into the semiconductor.

Gratzel et al developed a bis(bipyridyl) Ru(II) complex as a sensitizing dye for a dye-sensitized solar cell. This Ru complex has the structure cis-$X_2$ bis(2,2'-bipyridyl-4,4'-dicarboxylate) Ru(II), wherein X is Cl—, CN— or SCN—. The fluorescent light absorption, visible light absorption, electrochemical behavior and photoredox behavior of these sensitizing dyes have been studied systematically. Of these sensitizing dyes, cis-(diisocyanate)-bis(2,2'-bipyridyl-4,4'-dicarboxylate) Ru(II) has been shown to have far superior performance as a sensitizing dye for dye-sensitized solar cells.

Absorption of visible light by this sensitizing dye is by means of charge transfer transition from a metal to a ligand. The carboxyl groups of ligands in the photosensitizing dye coordinate directly to Ti ions on the surface of the titanium oxide electrode, resulting in close electronic contact between the photosensitizing dye and the titanium oxide electrode. It is said that as a result of this electronic contact, injection of electrons from the photosensitizing dye into the conduction band of titanium oxide occurs at extremely rapid speeds (1 picosecond or less), and recapture by the photosensitizing dye of electrons injected into the conduction band of titanium oxide occurs at speeds on the order of microseconds. This speed difference creates directionality of movement of the photoexcited electrons, which is why charge separation is so efficient. This is the essential feature of a Grätzel cell, distinguishing it from p-n junction-type solar cells in which charge separation is achieved by means of the potential gradient at the p-n junction surface.

In a photoelectric conversion element of the dye-sensitized type, a Ru complex, merocyanine or the like is used as the photosensitizing dye (Patent Document 1).

[Patent Document 1] Japanese Patent No. 4080288

SUMMARY OF INVENTION

Technical Problem

However, the performance of dye-sensitized photoelectric conversion elements has been disappointing in comparison with conventional silicon solar cells. One cause of this is recombination of the charge separated by light exposure. That is, photoexcited electrons in the titanium dioxide electrode react with the photosensitizing dye, or these photoexcited electrons react with holes that should be reducing the photosensitizing dye in the charge transfer layer, and the charge is not drawn to the outside of the device as a result. The aforementioned Ru complex or merocyanine dye has donor sites for donating electrons and acceptor sites for accepting electrons in its chemical structure, and charge recombination has been controlled by using these dyes, but not sufficiently.

In light of these matters, it is an object of the present invention to provide a light-absorbing material capable of achieving high photoelectric conversion efficiency when used in a photoelectric conversion element, along with a photoelectric conversion element having this light-absorbing material.

Solution to Problem

The light-absorbing material of the present invention has a structure represented by Formula (1) below:

X—Y    (1)

(wherein X represents a light-absorbing site, and Y represents a radical site that becomes a radical when in an oxidized state and/or when in a reduced state, and is capable of repeated oxidation-reduction).

In the present invention, Y in Formula (1) above may also be an electron donor to X.

In the present invention, Y in Formula (1) above may also be a nitroxide radical.

In the present invention, Y in Formula (1) above may also be an electron acceptor for X.

In the present invention, Y in Formula (1) above may also be any of a bipyridinium group, a substituted bipyridinium group, a galvinoxyl radical group and a substituted galvinoxyl radical group.

In the present invention, X in Formula (1) may also have a structure represented by any of General Formulae (A) to (C) below:

[C1]

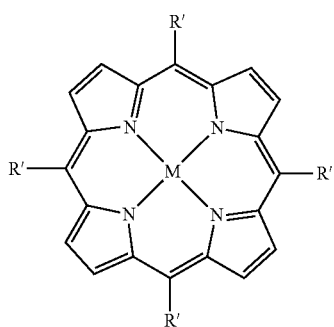

(A)

(in General Formula (A), each R' independently represents hydrogen or a carboxyl group, a sulfonyl group, a phenyl group, a carboxyphenyl group, a sulfophenyl group or a pyridinium group, and at least one R' substitutes for Y, and M is a metal atom);

[C2]

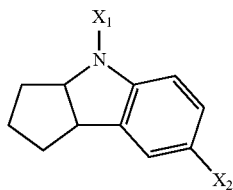

(B)

(in General Formula (B), $X_1$ and $X_2$ are each independently a group including at least one of an alkyl group, an alkenyl group, an aralkyl group, an aryl group and a heterocycle, and each may be substituted, and the radical site Y binds to either of $X_1$ and $X_2$);

[C3]

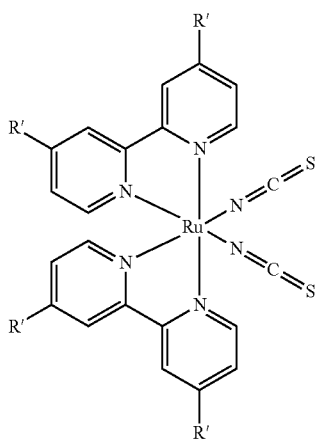

(C)

(in General Formula (C), each R' independently represents hydrogen or a carboxyl group, a sulfonyl group, a phenyl group, a carboxyphenyl group, a sulfophenyl group or a pyridinium group, and at least one R' substitutes for Y).

The photoelectric conversion element of the present invention is provided with this light-absorbing material, an electron transport layer and a hole transport layer.

Advantageous Effects of Invention

A light-absorbing material capable of achieving high photoelectric conversion efficiency when applied to a photoelectric conversion element, and a photoelectric conversion element having this light-absorbing material, are provided by the present invention.

DESCRIPTION OF EMBODIMENTS

Figure 1:
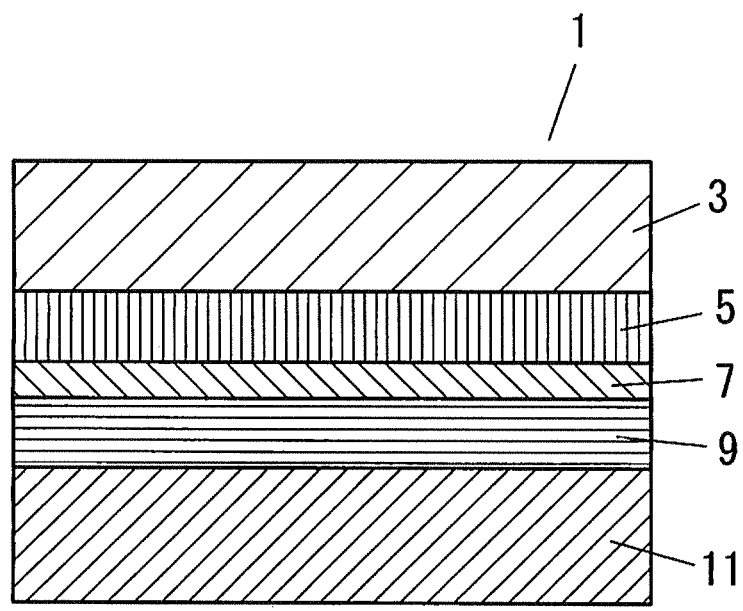
FIG. 1 is a cross-section of a photoelectric conversion element illustrating one embodiment of the present invention.

The light-absorbing material of this embodiment has the structure of Formula (1) below. This light-absorbing material can confer a superior photoelectric conversion function on a photoelectric conversion element.

$$X—Y \quad (1)$$

X represents a site that is excited by absorbing light, generating excited electrons (hereunder called a light-absorbing site), and Y represents a radical site that becomes a radical when in an oxidized state and/or when in a reduced state, and is capable of repeated oxidation-reduction (hereunder called a radical site). This light-absorbing material has a structure comprising an organic dye and a site bound to the dye that produces radicals by either or both of a photochemical or electrochemical oxidation reaction, and a photochemical or electrochemical reduction reaction.

Radical site Y is an electron donor to light-absorbing site X, or is an electron acceptor for light-absorbing site X.

In a light-absorbing material having the structure represented by Formula (1), radical site Y promotes the oxidation or reduction reaction of light-absorbing site X that occurs during the process of photoelectric conversion of the light-absorbing material. When light-absorbing material X is excited by absorbing light, charge moves between radical site Y and light-absorbing site X, and light-absorbing site X is reduced or oxidized as radical site Y is oxidized or reduced. That is, when radical site Y is an electron donor to light-absorbing site X, charge moves between radical site Y and light-absorbing site X when light-absorbing site X is excited by absorbing light, and light-absorbing site X is reduced while radical site Y is oxidized. Radical site Y is subsequently reduced by the movement of holes from the oxidized radical site Y to the charge transport layer or the like, while light-absorbing site X is oxidized by the movement of electrons from the reduced light-absorbing site X to the electron transport layer or the like. When radical site Y is an electron acceptor for light-absorbing site X, charge moves between radical site Y and light-absorbing site X when light-absorbing site X is excited by absorbing light, and light-absorbing site X is oxidized as radical site Y is reduced. Light-absorbing site X is subsequently reduced by the movement of holes from the oxidized light-absorbing site X to the charge transport layer or the like, while radical site Y is oxidized by the movement of electrons from the reduced radical site Y to the electron transport layer or the like. This results in high-speed charge separation in the light-absorbing material. This high-speed oxidation-reduction reaction occurs due to binding between light-absorbing site X and radical site Y, and also involves electrons in a radical state in radical site Y. When radical site Y is not bound to light-absorbing site X or when no stable free radical site Y exists, the oxidation-reduction reaction of light-absorbing site X is slowed. This phenomenon can be confirmed by investigating time changes in light absorption in the oxidized state or reduced state of light-absorbing site X by spectroscopy using a pulse laser.

Radical site Y is not an active site that generates radicals, but a site capable of being a stable radical. As a benchmark for the stability of the radical and the amount of the radical when radical site Y is a radical, the spin concentration per molecule of the light-absorbing material in an equilibrium state is preferably 1 or more for a duration of 1 second or more. In this case, a stable oxidation-reduction reaction occurs under conditions of continuous light irradiation. When radical site Y has been oxidized or reduced, it is returned to its original state by the hole transport layer or electron transport layer. The upper limit of the spin concentration per molecule of the light-absorbing material is preferably 10,000, but this is not a limitation.

Normally, an excited electron or hole generated when a single light-absorbing site X absorbs light moves to a single radical site Y, and this radical site Y is reduced or oxidized. However, when the light-absorbing material is a material with a relatively large molecular weight such as one with an oligomer structure or polymer structure, and the spin concentration per molecule of the light-absorbing material is 2 or more, an electron from a radical site Y reduced or oxidized in the aforementioned process may move to another radical site Y in the same molecule by an electron self-exchange reaction. This is the phenomenon called charge hopping transport, whereby charge can move efficiently if the spin concentration is as described above. Separation of excited electrons and holes generated by light-absorbing site X is promoted by this effect immediately after photoexcitation, further suppressing charge recombination and effectively improving the output characteristics of the photoelectric conversion element. The radical spin concentration is assayed with an electron spin resonance device.

Radical site Y as an electron donor to light-absorbing site X is explained next. In this case, when light-absorbing site X is photoexcited, holes move rapidly from light-absorbing site X to radical site Y, and rapid charge separation occurs.

Examples of the chemical structure of a radical site Y capable of being an electron donor to light-absorbing material X include the radical structures described in Japanese Patent No. 3687736 and Japanese Patent Application Laid-open No. 2003-100360. A radical site Y that becomes an electron donor to light-absorbing site X preferably has a nitroxide radical (—N—O·) structure in particular. In this case, the photoexcited light-absorbing site X is more rapidly reduced by radical site Y.

The structures shown by Structural Formulae (2) to (5) below are specific examples of the structure of a radical site Y having a nitroxide radical (—N—O·). A in Formulae (2) to (5) represents a binding site between radical site Y and the light-absorbing site as discussed below, but A need not be present.

[C4]
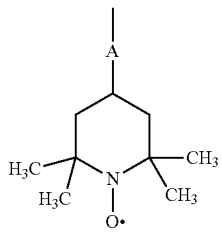
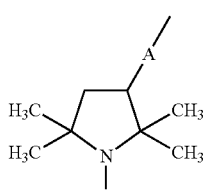
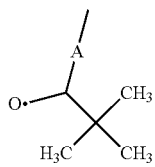
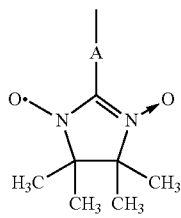
Radical site Y may also include a hydrazyl radical. In this case, the photoexcited light-absorbing site X is more rapidly reduced by radical site Y.
A radical site Y capable of being an electron donor to light-absorbing site X as discussed above is derived for example from the compounds represented by [C5] and [C6] below.
[C5]
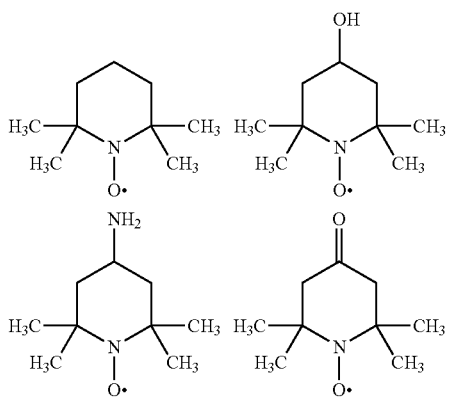
(2)
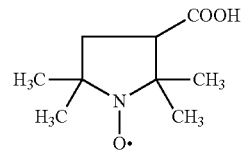
(3)
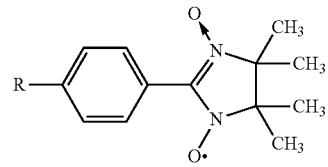
R; H or NO2
(4)
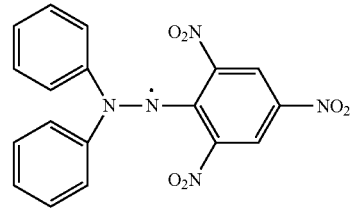
diphenylpicrylhydrazyl
[C6]
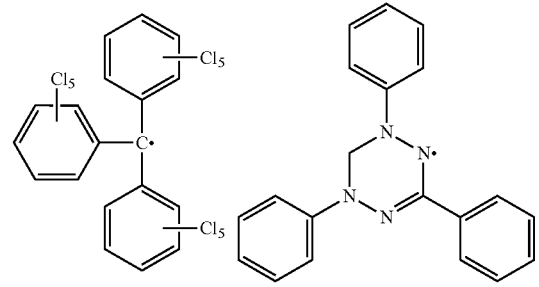
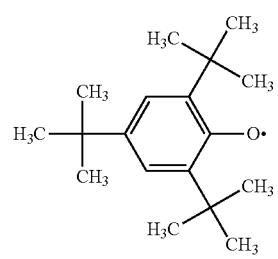
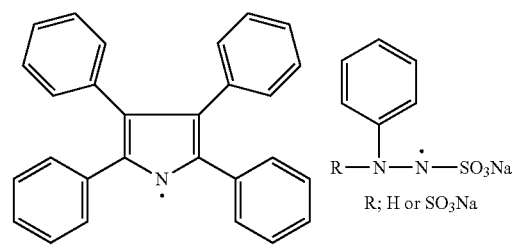
R; H or SO3Na -continued

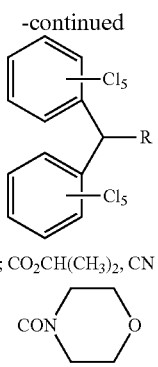
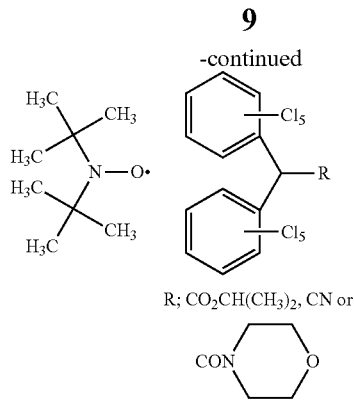

R; CO₂CH(CH₃)₂, CN or

CON⌐O

When a radical site Y capable of being an electron donor to light-absorbing site X is a radical in a ground state, it must be thermodynamically stabilized or kinetically stabilized. In the first case stabilization is achieved by a resonance effect for example, while in the second case stabilization is achieved by the steric effect of a tetramethyl structure or the like for example.

Radical site Y as an electron acceptor for light-absorbing site X is explained next. In this case, when light-absorbing site X is photoexcited, electrons move rapidly from light-absorbing site X to radical site Y, and rapid charge separation occurs.

A radical site Y capable of being an electron acceptor for light-absorbing site X preferably includes any of a bipyridinium group, a substituted bipyridinium group, a galvinoxyl radical group and a substituted galvinoxyl radical group. In particular, this radical site Y is preferably provided with the structure represented by [C7] below or the structure represented by [C8] below as at least part of its chemical structure.

[C7]

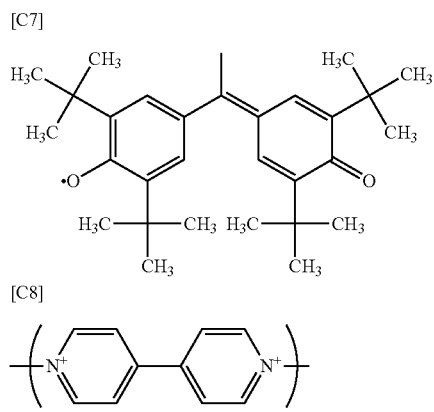

[C8]

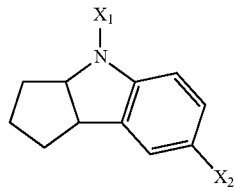

Examples of the chemical structure of light-absorbing site X include Ru(4,4'-dicarboxyl-2,2'-bipyridine)₂-(NCS)₂ and other ruthenium metal complexes (Ru metal complexes) described in the books All About Solar Cells—from Semiconductors to Dye-Sensitized (Pub. Joho Gijutsu Kyokai) and Newest Technology and Materials Development for FPDs, DSSCs, Optical Memory and Functional Dyes (Pub. NTS) and the like, as well as porphyrin metal complexes and other complexes; associative dyes such as indoline, coumarin, merocyanine, squalirium and other organic dyes; phthalocyanine, dioxazine, azo (soluble and insoluble azo), threne, quinacridone and other pigments; sulfide semiconductors such as cadmium sulfide, lead sulfide and silver sulfide; and other ultrafine semiconductor particles and the like. When light-absorbing site X has the molecular structure of a dye, charge is separated inside light-absorbing site X during photoexcitation if this light-absorbing site X has a so-called donor-acceptor type molecular structure, which is effective for improving the open-circuit voltage and short-circuit current of the photoelectric conversion element.

When light-absorbing site X has the chemical structure of an associative dye, a photoelectric conversion element can be obtained with characteristics (luminous efficiency) about 5 times those obtained with conventional ruthenium complexes. Furthermore, when light-absorbing site X has a dye structure such as that disclosed in Japanese Patent No. 4080288 for example, the effect of suppressing radical side-reactions during light exposure (optical stabilization effect) can be expected.

Light-absorbing site X preferably has any of the structures represented by General Formulae (A) to (C) below in particularly. When light-absorbing site X has these structures, light-absorbing site X is efficiently photoexcited by absorbing light, resulting in a rapid oxidation-reduction reaction between light-absorbing site X and radical site Y.

[C9]

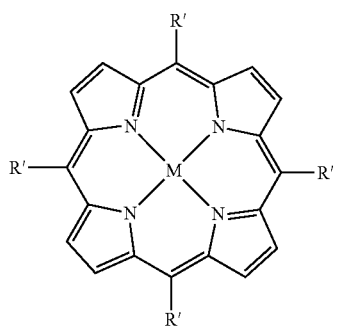

(A)

In General Formula (A), R' represents hydrogen or a carboxyl group, a sulfonyl group, a phenyl group, a carboxyphenyl group, a sulfophenyl group or a pyridinium group, and at least one R' substitutes for Y. M represents a metal atom. In order to stabilize the structure represented by Structural Formula (A), M is preferably a transition metal atom such as Zn.

[C10]

(B)

$X_1$ and $X_2$ each independently represent a group including at least one of an alkyl group, an alkenyl group, an aralkenyl group, an aryl group and a heterocycle, and each may be substituted. Radical site Y binds to either $X_1$ or $X_2$.

[C11]

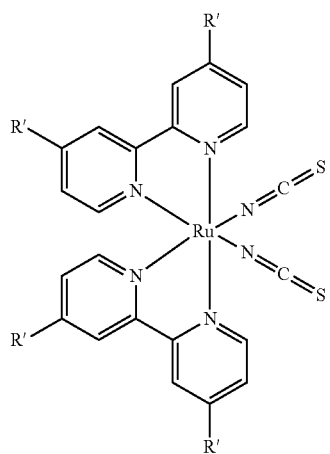

(C)

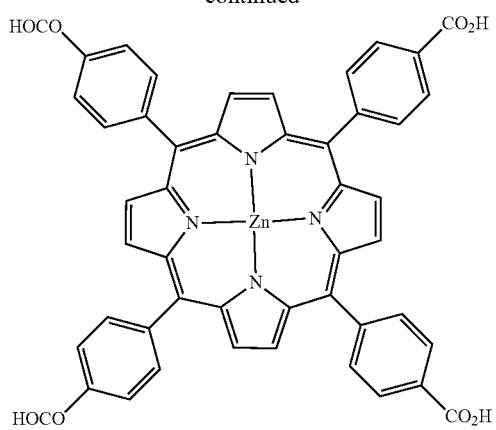

In General Formula (C), R' represents hydrogen or a carboxyl group, a sulfonyl group, a phenyl group, a carboxyphenyl group, a sulfophenyl group or a pyridinium group, and at least one R' substitutes for Y.

A light-absorbing site X having a structure such as that represented by General Formula (A) is derived for example from the compound represented by [C12] below.

[C12]

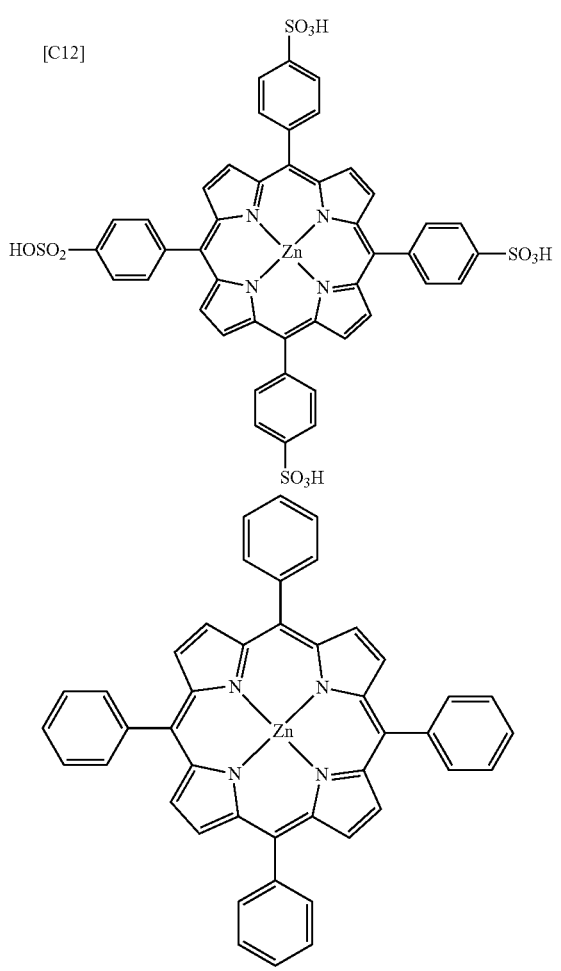

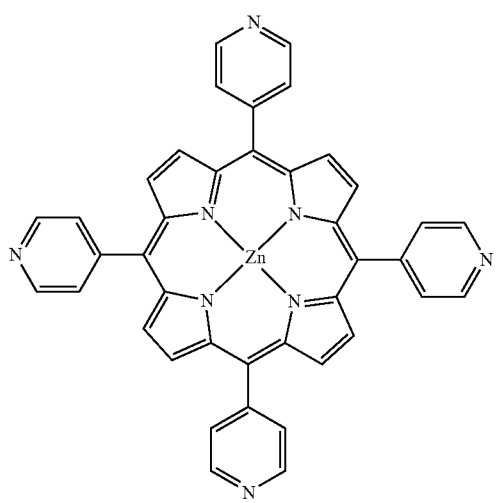

A light-absorbing site X having a structure such as that represented by General Formula (C) is derived for example from the compound represented by [C13] below.

[C13]

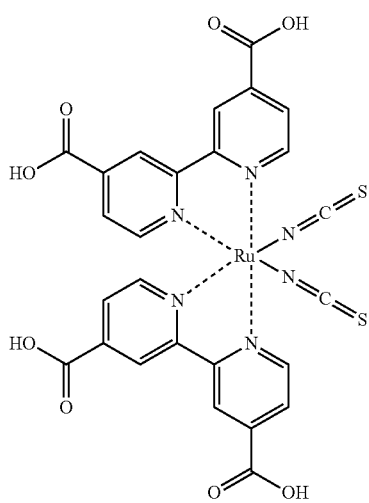

Ru(bpy)₂NCS

Structure Formulae (6) to (13) below show examples of the structures of light-absorbing materials provided with radical sites Y that act as electron donors to light-absorbing site X.
[C14]
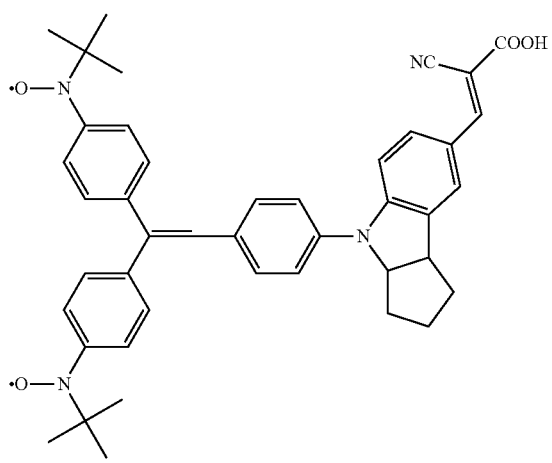
(6)
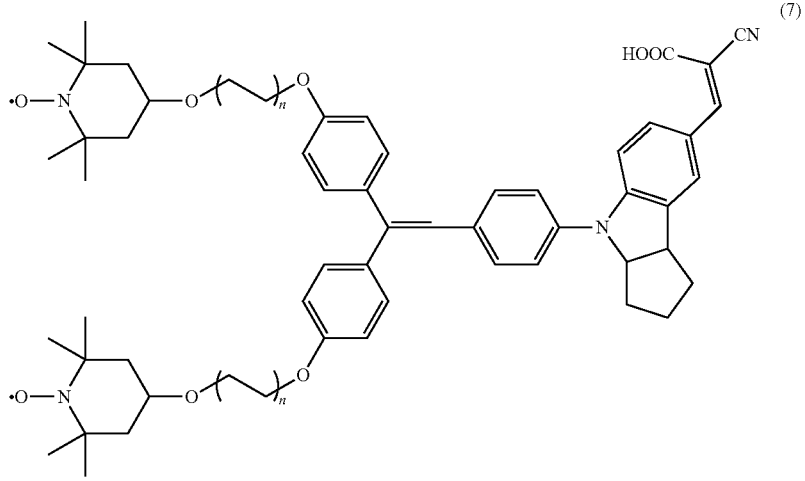
(7)
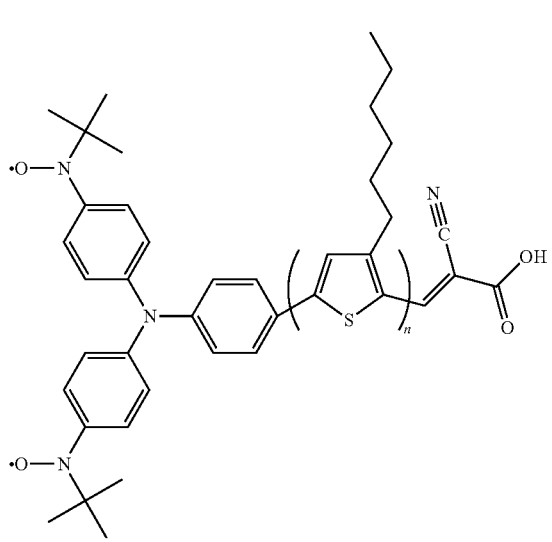
(8)

In Formula (7), n is an integer from 0 to 10. In Formula (8), n is an integer from 1 to 20.
[C15]
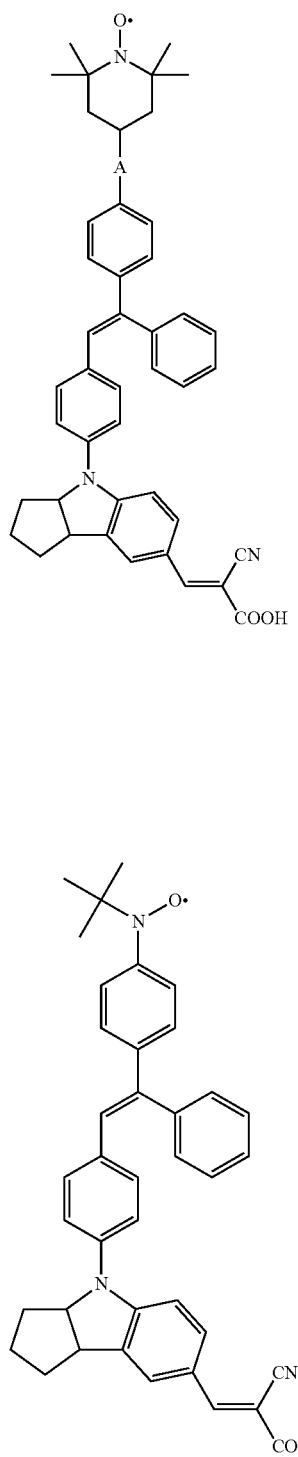
(9)
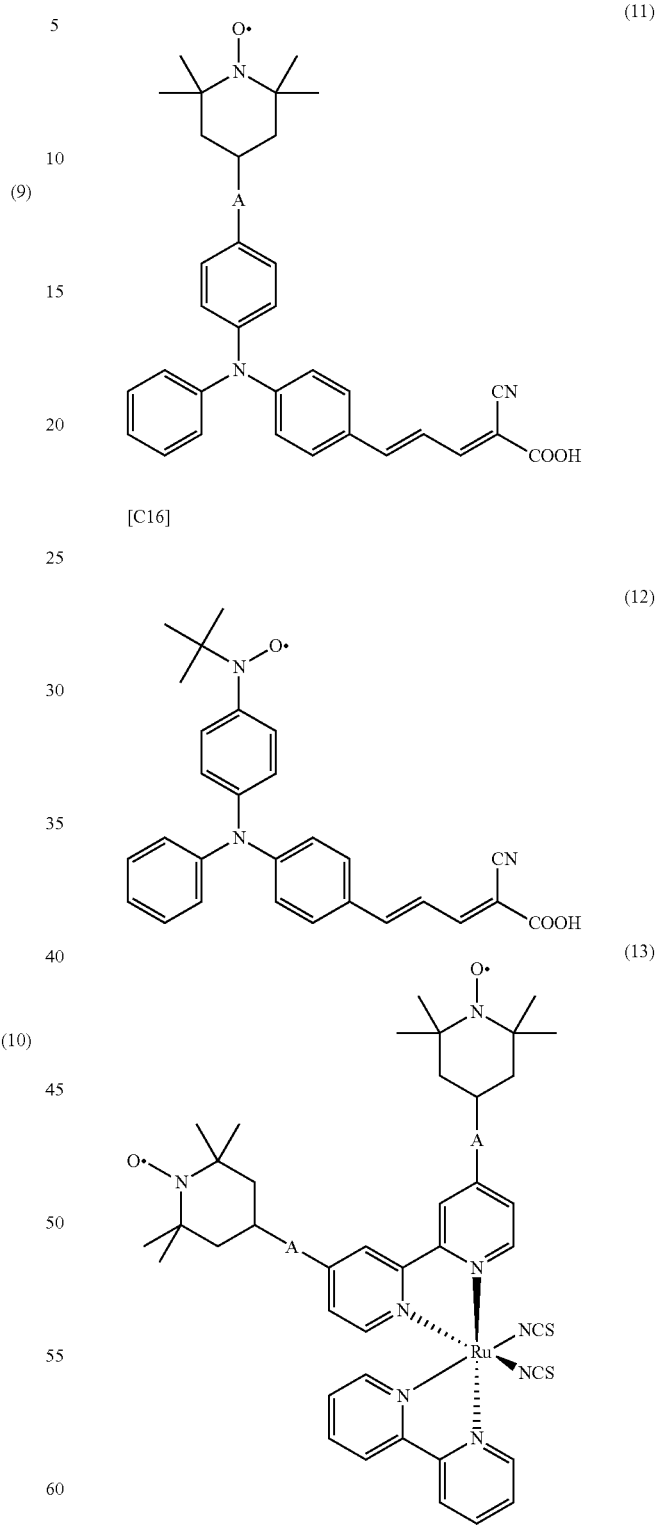
[C16]
Structural Formulae (14) to (18) below show examples of the structures of light-absorbing materials provided with radical sites Y that act as electron acceptors for light-absorbing site X.

[C17]

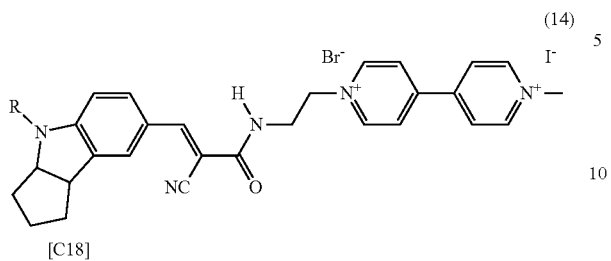

(14)

[C18]

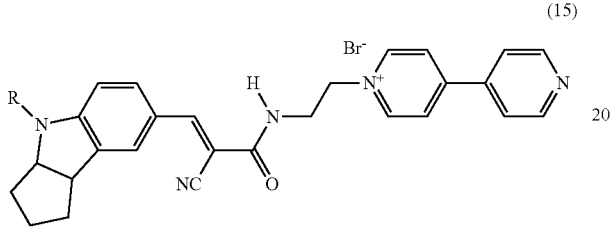

(15)

[C19]

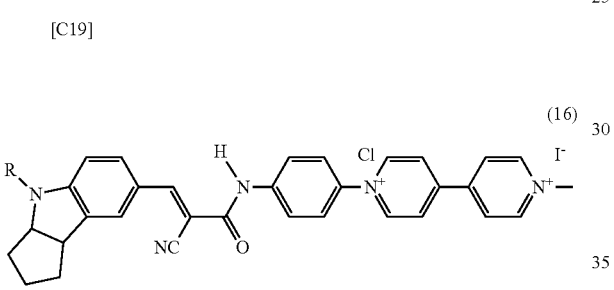

(16)

[C20]

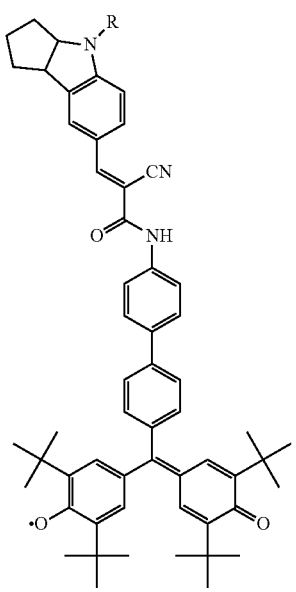

(17)

[C21]

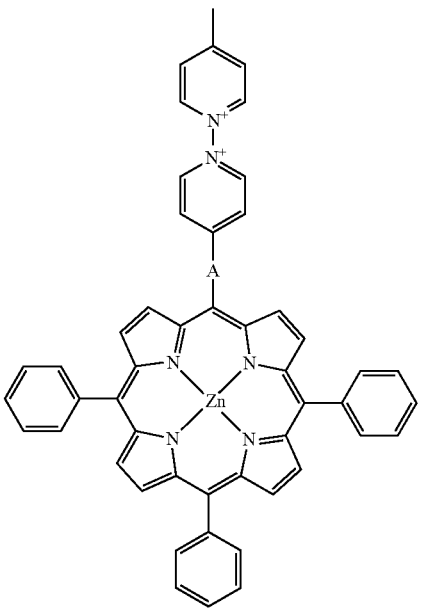

(18)

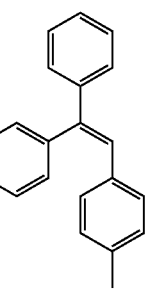

In the light-absorbing material, if a π-conjugated structure in light-absorbing site X spreads to an unpaired electron of radical site Y, the range of absorption wavelengths becomes broader, thereby increasing the light-absorbing efficiency of the light-absorbing material, and further improving the short-circuit current of the photoelectric conversion element.

The light-absorbing material may also have a binding site A between radical site Y and light-absorbing site X. Binding site A is not essential, and light-absorbing site X and radical site Y may be bound together directly.

Examples of binding site A include various bivalent groups. For example, it is desirable to use a straight or branched, optionally substituted bivalent saturated hydrocarbon group, such as methylene, ethylene, propane-1,3-dienyl, ethylidene, propane-2,2-diyl, alkanediyl, benzylidene, propylene, i-propylene, butylene, t-butylene, octylene, 2-ethylhexylene, 2-methoxyethylene, benzylene, trifluoromethylene, cyanomethylene, ethoxycarbonylmethylene, propoxyethylene, 3-(1-octylpyridinium-4-yl)propylene, 3-(1-butyl-3-methylpyridinium-4-yl)propylene or the like; a bivalent unsaturated hydrocarbon group such as vinylidene, propene-1,3-diyl, but-1-ene-1,4-diyl or the like; a bivalent cyclic hydrocarbon group such as cyclohexanediyl, cyclohexenediyl, cyclohexadienediyl, phenylene, napthalene, biphenylene or the like; an oxalyl, maronyl, succinyl, glutanyl, adipoyl, alkanedioyl, sebacoyl, fumaroyl, maleoyl, phthaloyl, isophthaloyl, terephthaloyl or other keto group or bivalent acyl group, or an oxy, oxymethylenoxy, oxycarbonyl or other ether group; an ester; a sulfanediyl, sulfanyl, sulfonyl or other sulfur-containing group; an imino, nitrilo, hydrazo, azo, azino, diazoamino, urylene, amido or other nitrogen-containing group; a silane diyl, disilane-1,2-diyl or other silicon-containing group; or a group comprising such a group with a terminal substitution, or a group obtained by complexing such a group.

When light-absorbing site X is organic, it is desirable for light-absorbing site X and radical site Y to have π-conjugating structures in the light-absorbing material, since this shifts the light-absorbing region of the light-absorbing material to longer wavelengths.

When the photoelectric conversion element has an electron transport layer or hole transport layer, the charge transfer efficiency is further improved if the light-absorbing material is bound to at least one of the electron transport layer and the hole transport layer. The mode of binding between the light-absorbing material and the electron transport layer or hole transport layer is not particularly limited, but in the case of binding between the light-absorbing material and an electron transport layer formed from an oxide semiconductor, a light-absorbing material having a carboxyl group, sulfa group, phosphone group or other group can be used to increase the binding force with the electron transport layer. The light-absorbing material is strongly bound to the electron transport layer by means of the binding of these groups with the electron transport layer. In the case of binding between the light-absorbing material and an electron transport layer formed from an organic semiconductor, a light-absorbing material having a functional group with high adsorbability on organic semiconductors or a functional group that binds chemically with organic semiconductors can be used.

A light-absorbing material having a radical site Y that acts as an electron donor to light-absorbing site X can be manufactured as follows for example. In FIGS. 4 to 22, "o.n." means "one night", while "r.t." means "room temperature".

The light-absorbing material shown by Structural Formula (6) above is manufactured by the process shown by [C22], [C23], and FIGS. 4 to 9.

Figure 4:
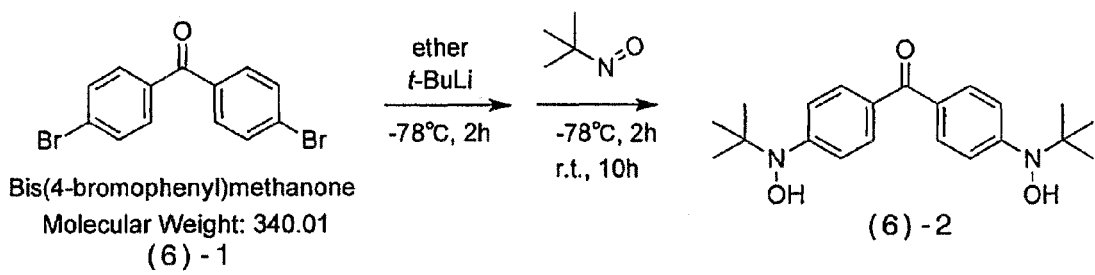
FIG. 4 is an explanatory drawing showing the manufacturing steps for the light-absorbing material shown by Structural Formula (6).
Figure 4:
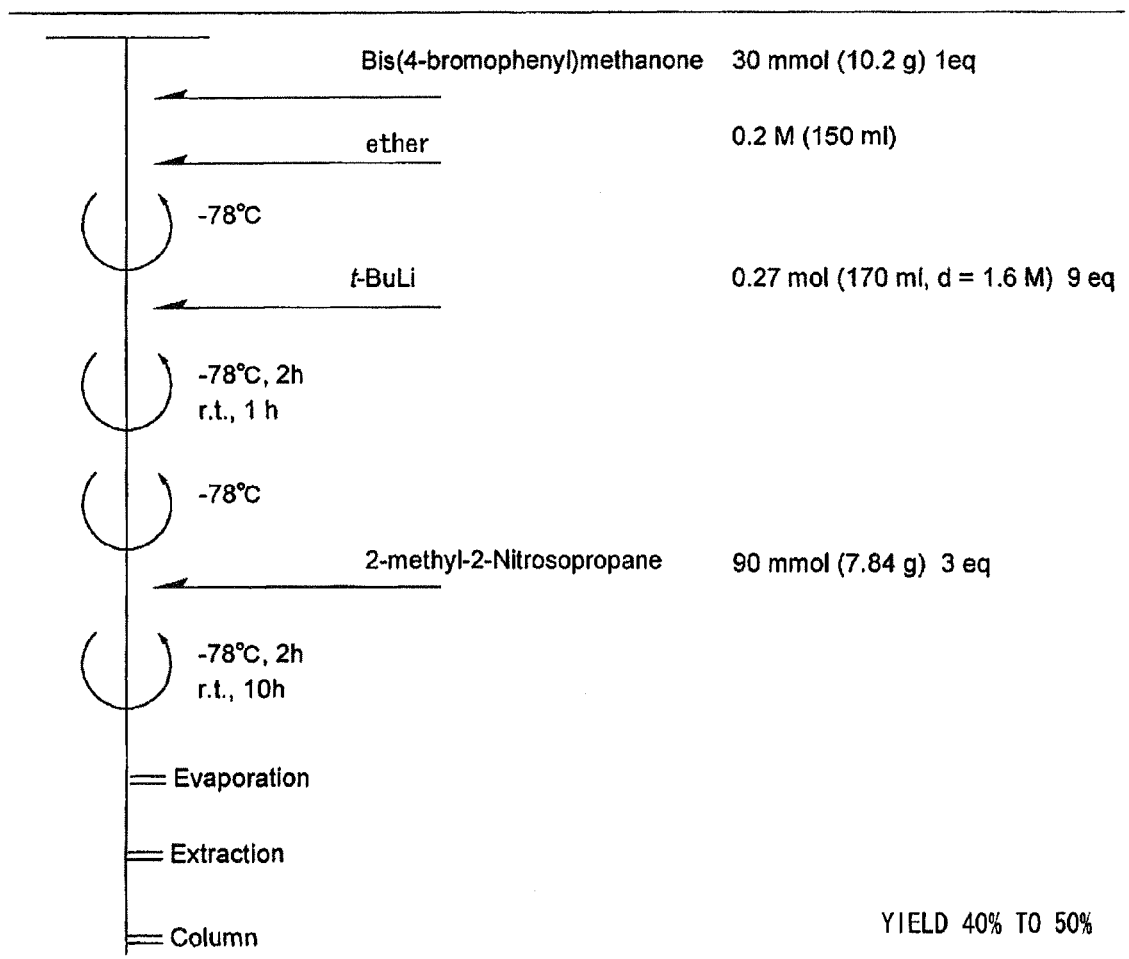

First, as shown in FIG. 4, the compound shown by Structural Formula (6)-1 and diethyl ether are agitated and mixed at −78° C., and tert-butyl lithium is added to the mixture, which is agitated and mixed for 2 hours at −78° C. and then agitated and mixed for 1 hour at room temperature. 2-methyl-2-nitrosopropane is added to the resulting mixture, which is agitated and mixed for 2 hours at −78° C., and then agitated and mixed for 10 hours at room temperature to obtain the compound represented by Structural Formula (6)-2 (yield 40% to 50%).

Figure 5:
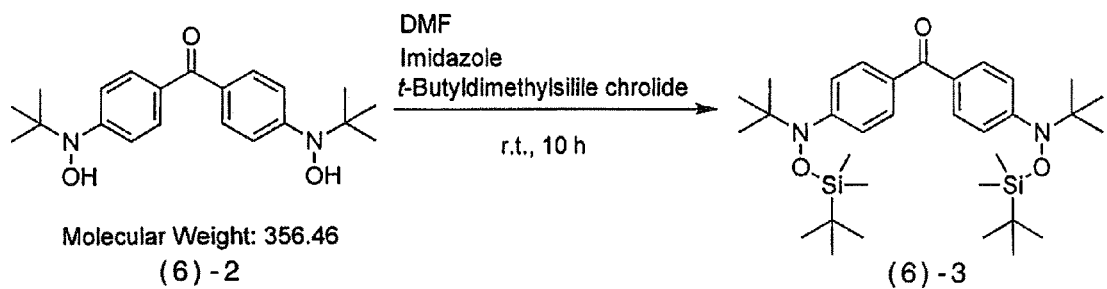
FIG. 5 is an explanatory drawing showing the manufacturing steps for the light-absorbing material shown by Structural Formula (6).

Next, as shown in FIG. 5, the compound represented by Structural Formula (6)-2, N,N-dimethylformamide (DMF), imidazole and tert-butyldimethylsilyl chloride are agitated and mixed for 10 hours at room temperature to obtain the compound represented by Structural Formula (6)-3 (yield 80% to 90%).

Figure 6:
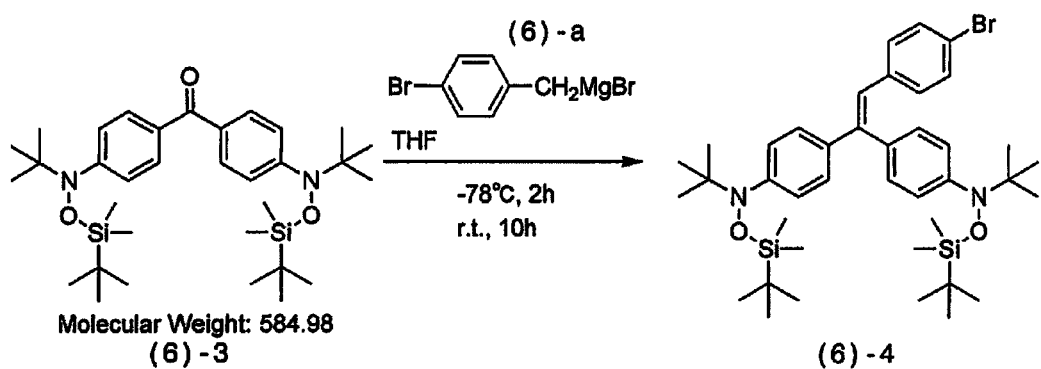
FIG. 6 is an explanatory drawing showing the manufacturing steps for the light-absorbing material shown by Structural Formula (6).
Figure 6:
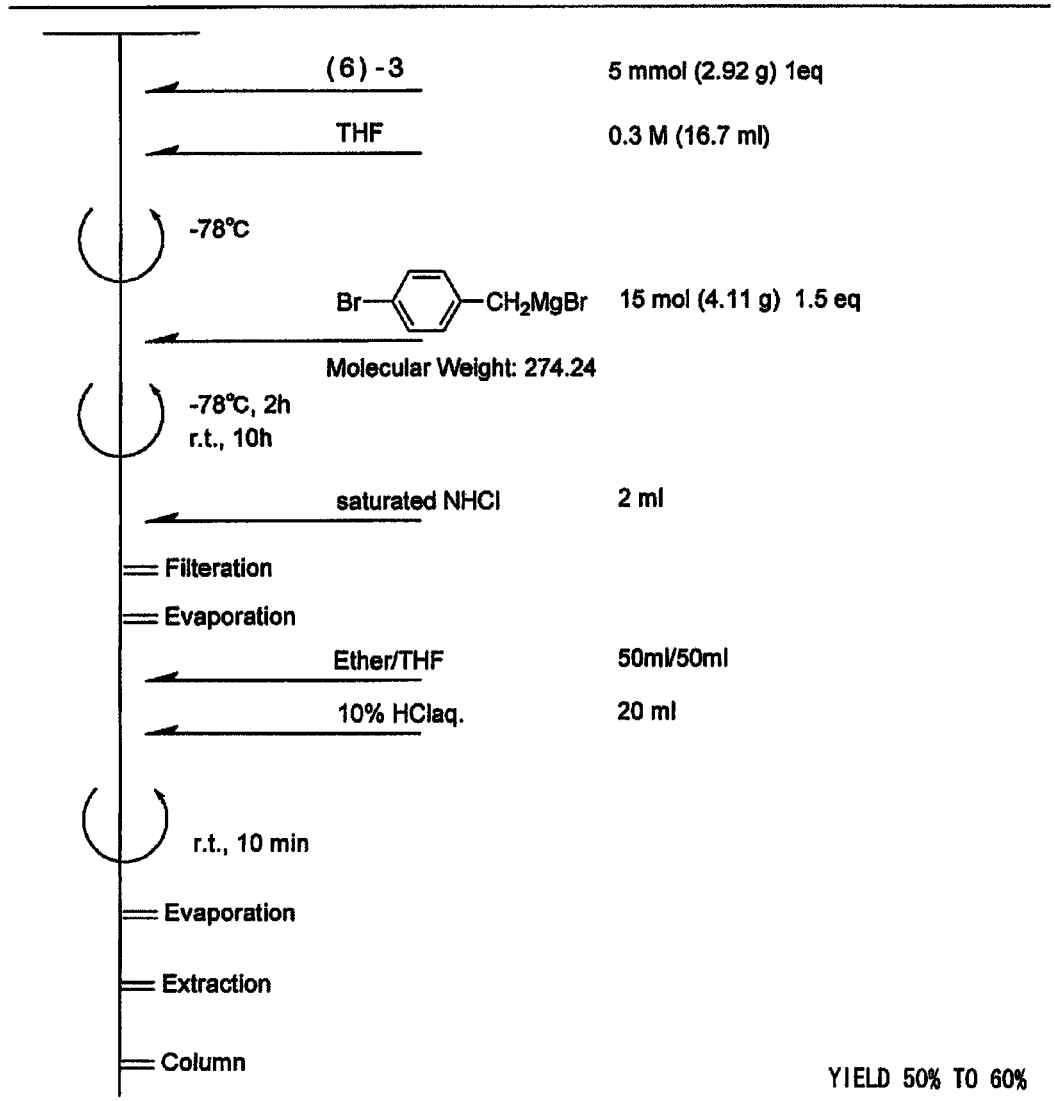

Next, as shown in FIG. 6, the compound represented by Structural Formula (6)-3 and tetrahydrofuran are agitated and mixed at −78° C., the compound represented by Structural Formula (6)-a is added, and the mixture is agitated and mixed for 2 hours at −78° C. and then agitated and mixed for 10 hours at room temperature. Monochloramine saturated solution, diethyl ether, tetrahydrofuran and 10% aqueous hydrochloric acid solution are added sequentially to the resulting mixture, and agitated and mixed for 10 minutes at room temperature to obtain the compound represented by Structural Formula (6)-4 (yield 50% to 60%).

Figure 7:
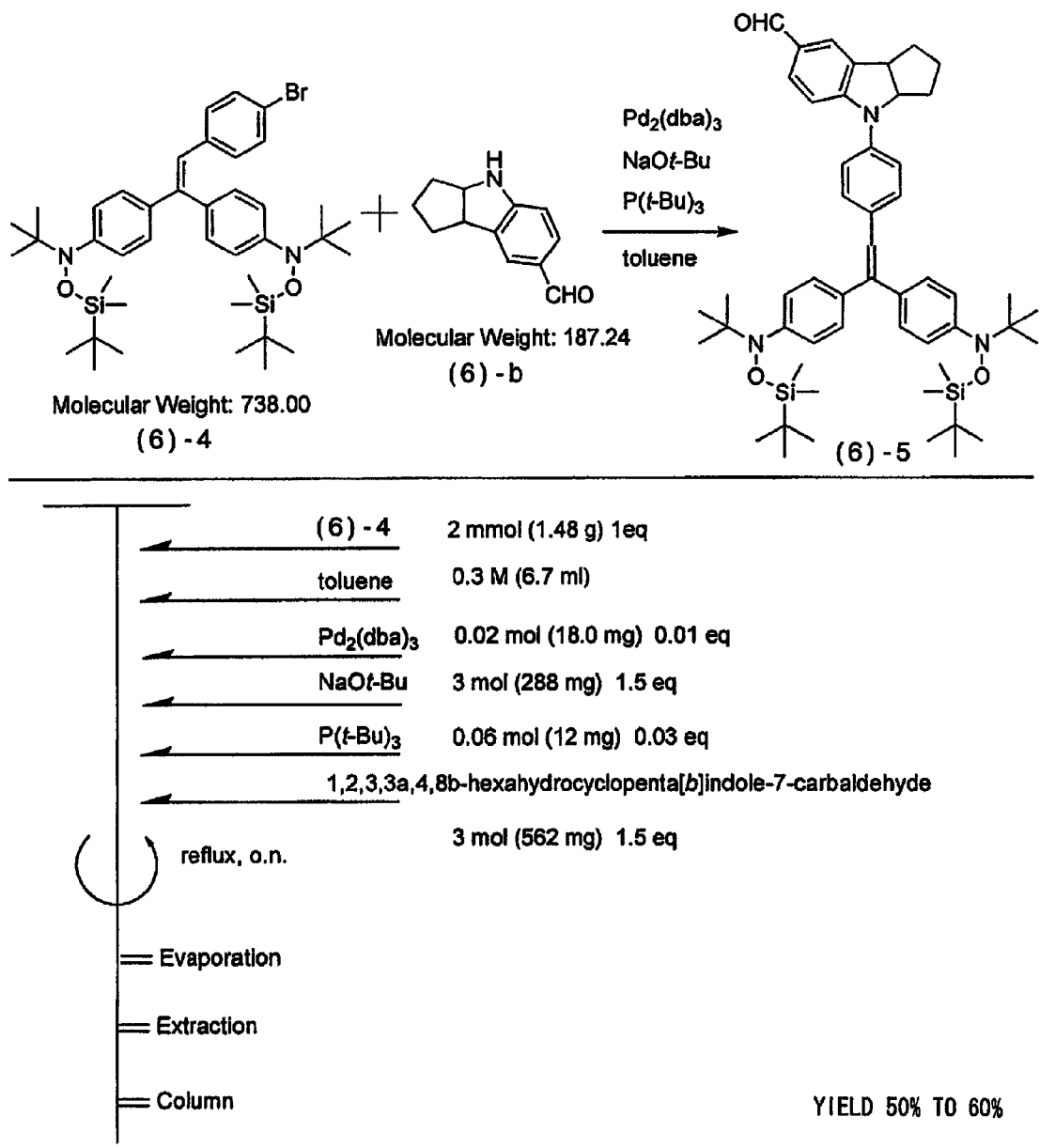
FIG. 7 is an explanatory drawing showing the manufacturing steps for the light-absorbing material shown by Structural Formula (6).

Next, as shown in FIG. 7, the compound represented by Structural Formula (6)-4, the compound represented by Structural Formula (6)-b, tris(dibenzylidenacetone) dipalladium (0), sodium tert-butoxide, tri tert-butylphosphine and toluene are mixed and refluxed overnight to obtain the compound represented by Structural Formula (6)-5 (yield 50% to 60%).

Figure 8:
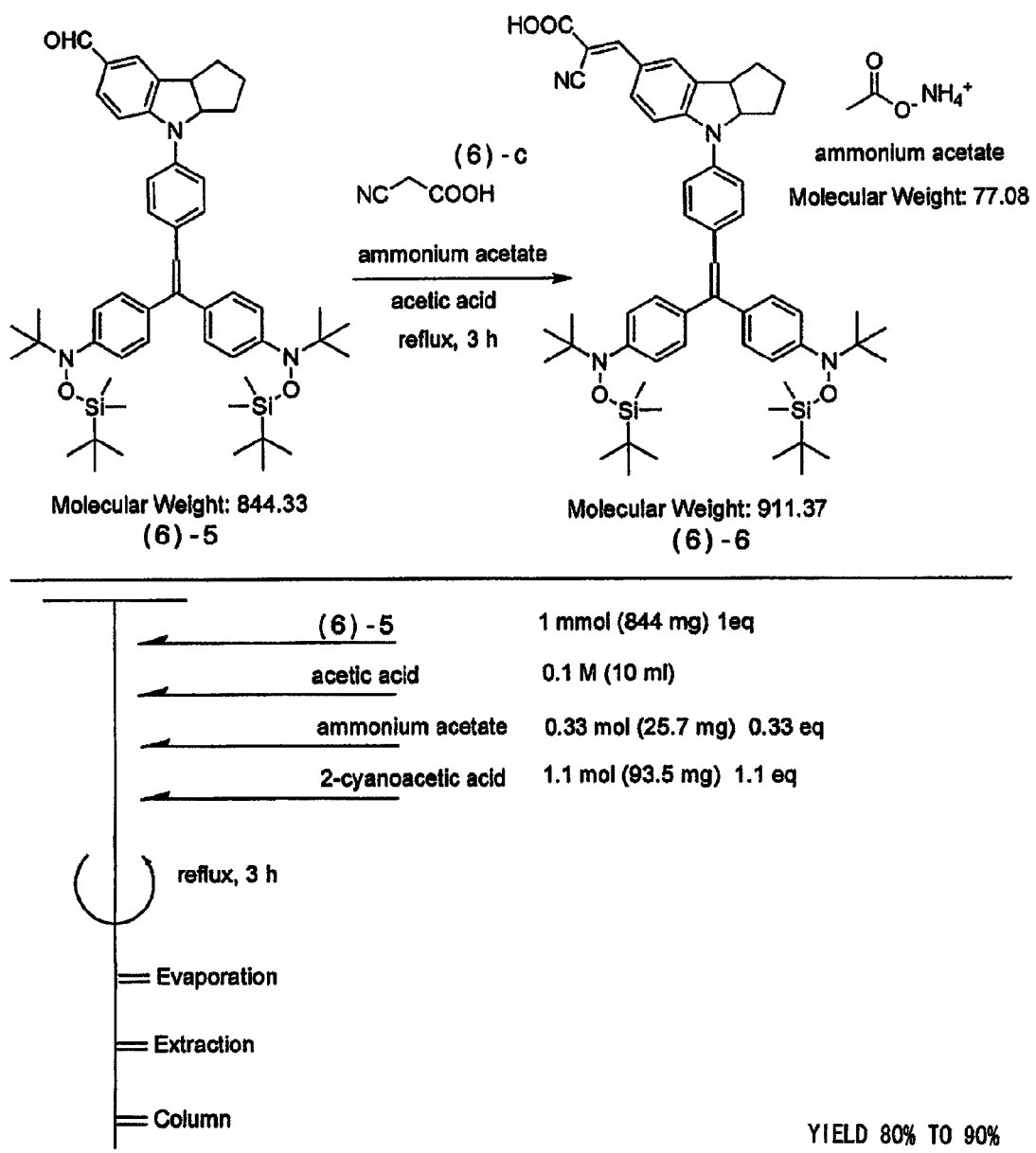
FIG. 8 is an explanatory drawing showing the manufacturing steps for the light-absorbing material shown by Structural Formula (6).

Next, as shown in FIG. 8, the compound represented by Structural Formula (6)-5, the compound represented by Structural Formula (6)-c, ammonium acetate and acetic acid are mixed and refluxed for 3 hours to obtain the compound represented by Structural Formula (6)-6 (yield 80% to 90%).

Figure 9:
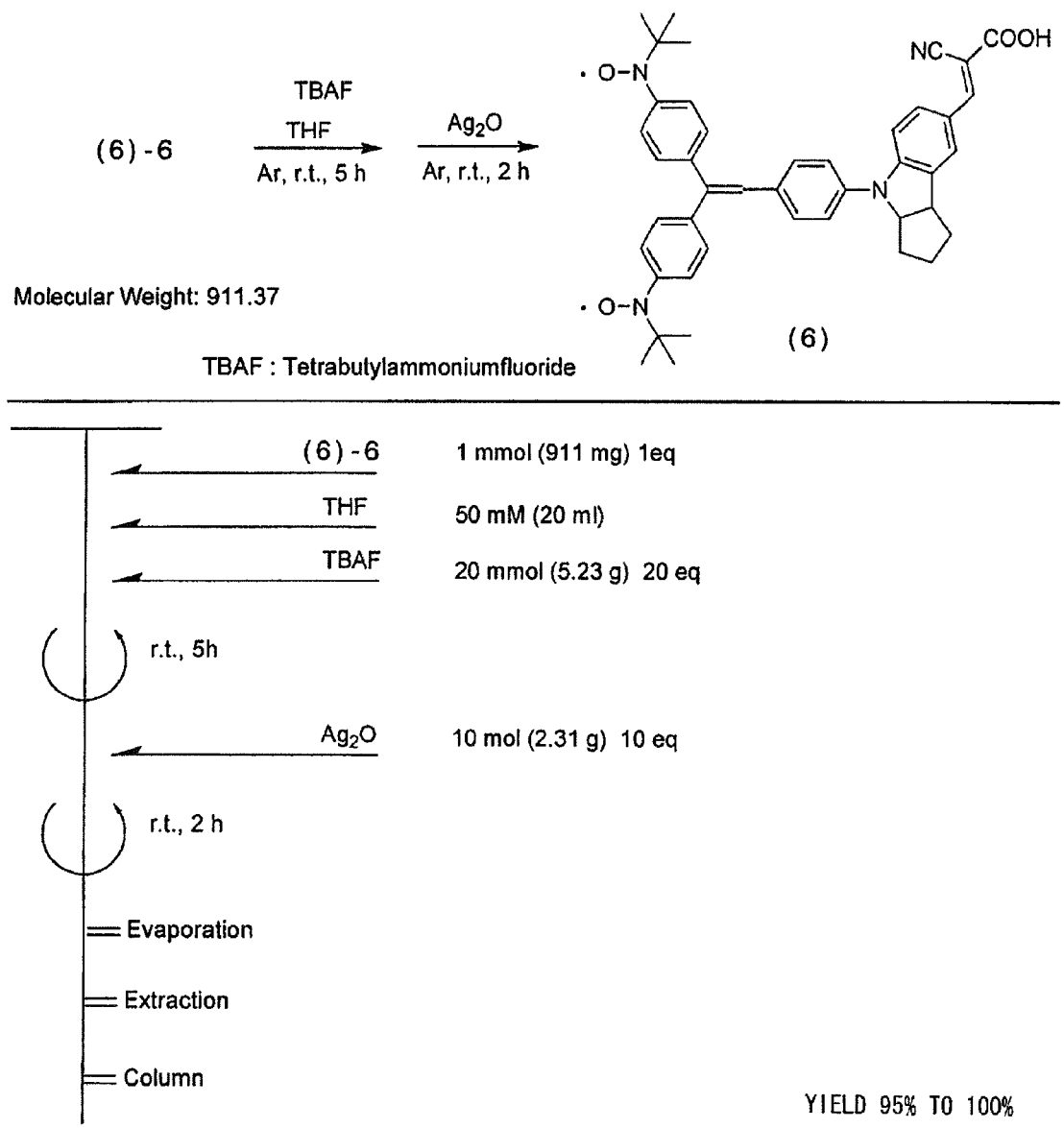
FIG. 9 is an explanatory drawing showing the manufacturing steps for the light-absorbing material shown by Structural Formula (6).

Next, as shown in FIG. 9, the compound represented by Structural Formula (6)-6, tetra-n-butylammonium fluoride (TBAF) and tetrahydrofuran are agitated and mixed for 5 hours at room temperature in an argon atmosphere, silver oxide is added, and the mixture is further agitated and mixed for 2 hours at room temperature in an argon atmosphere to obtain the compound represented by Structural Formula (6) (yield 95% to 100%).

[C22]

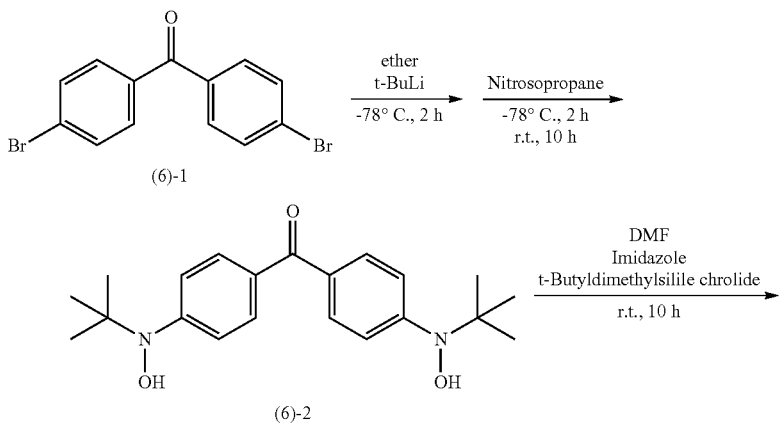

-continued
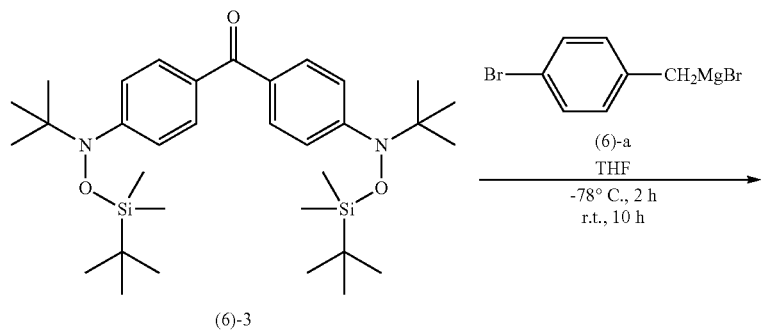
(6)-3
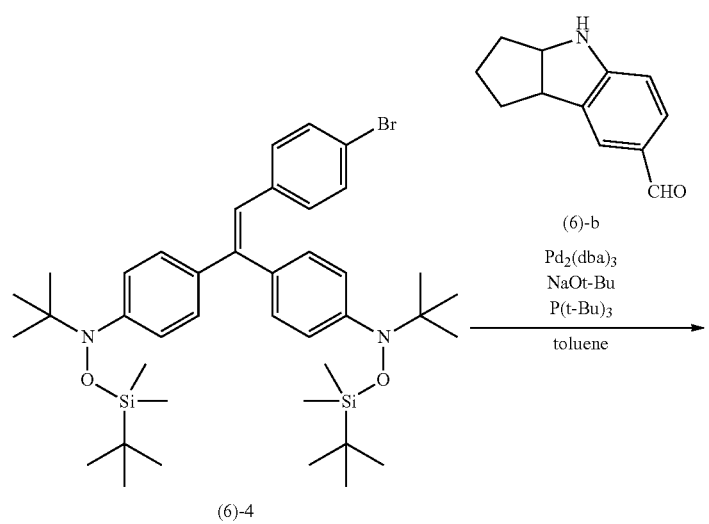
(6)-4
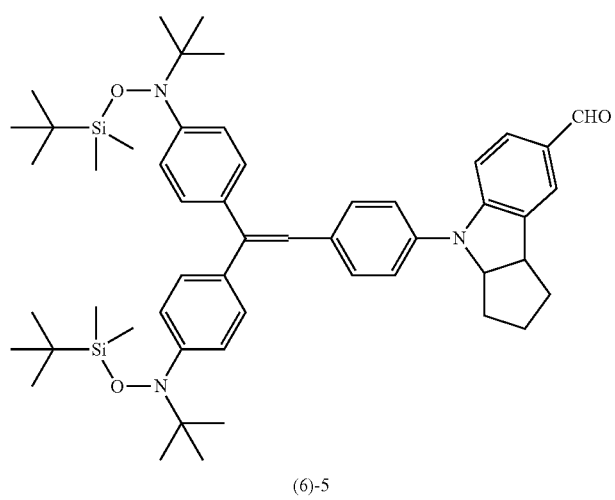
(6)-5

[C23]

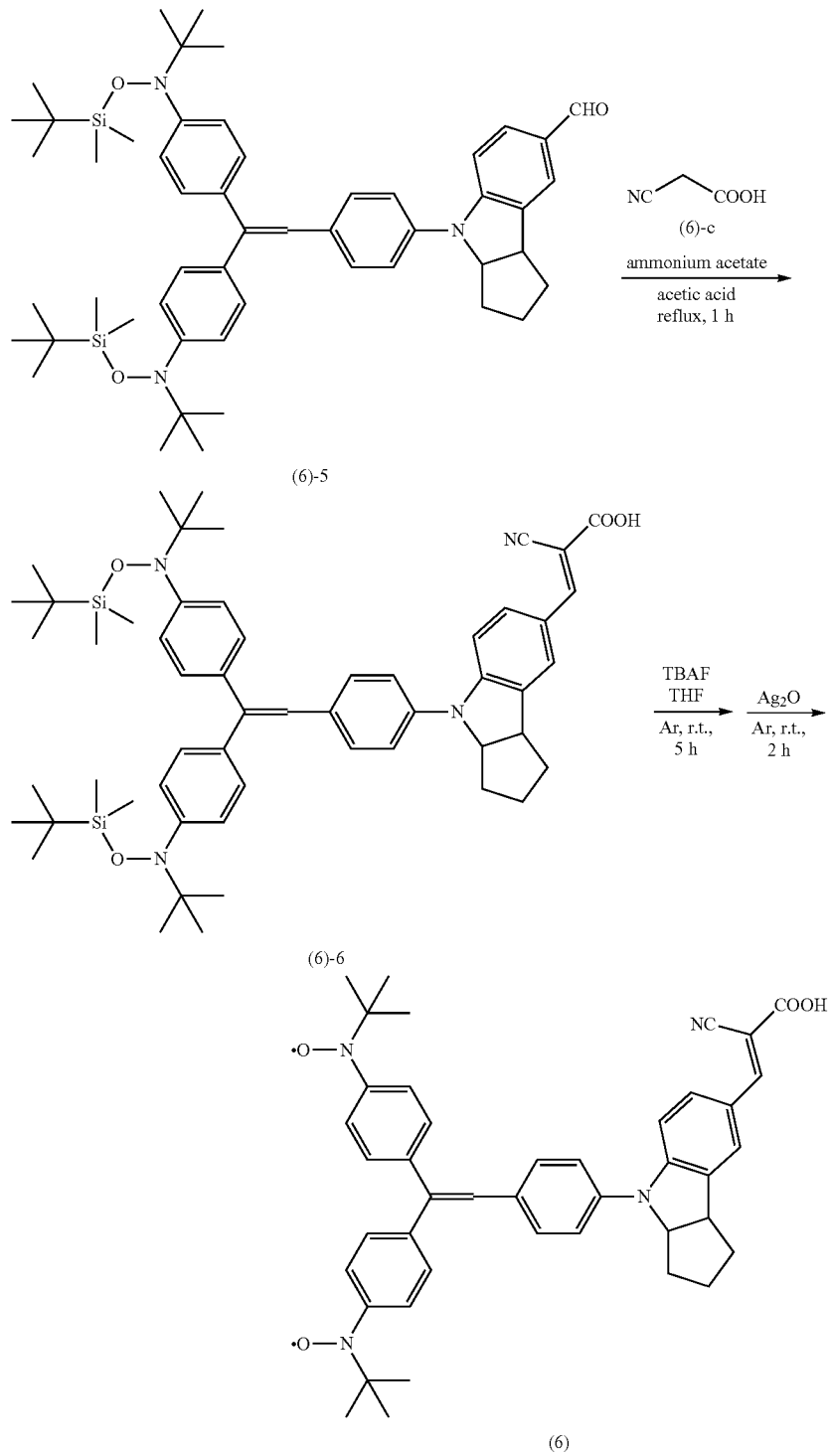

The light-absorbing material represented by Structural Formula (7) above is manufactured by the process shown in [C28] and [C29], and FIGS. 10 to 15.

Figure 10:
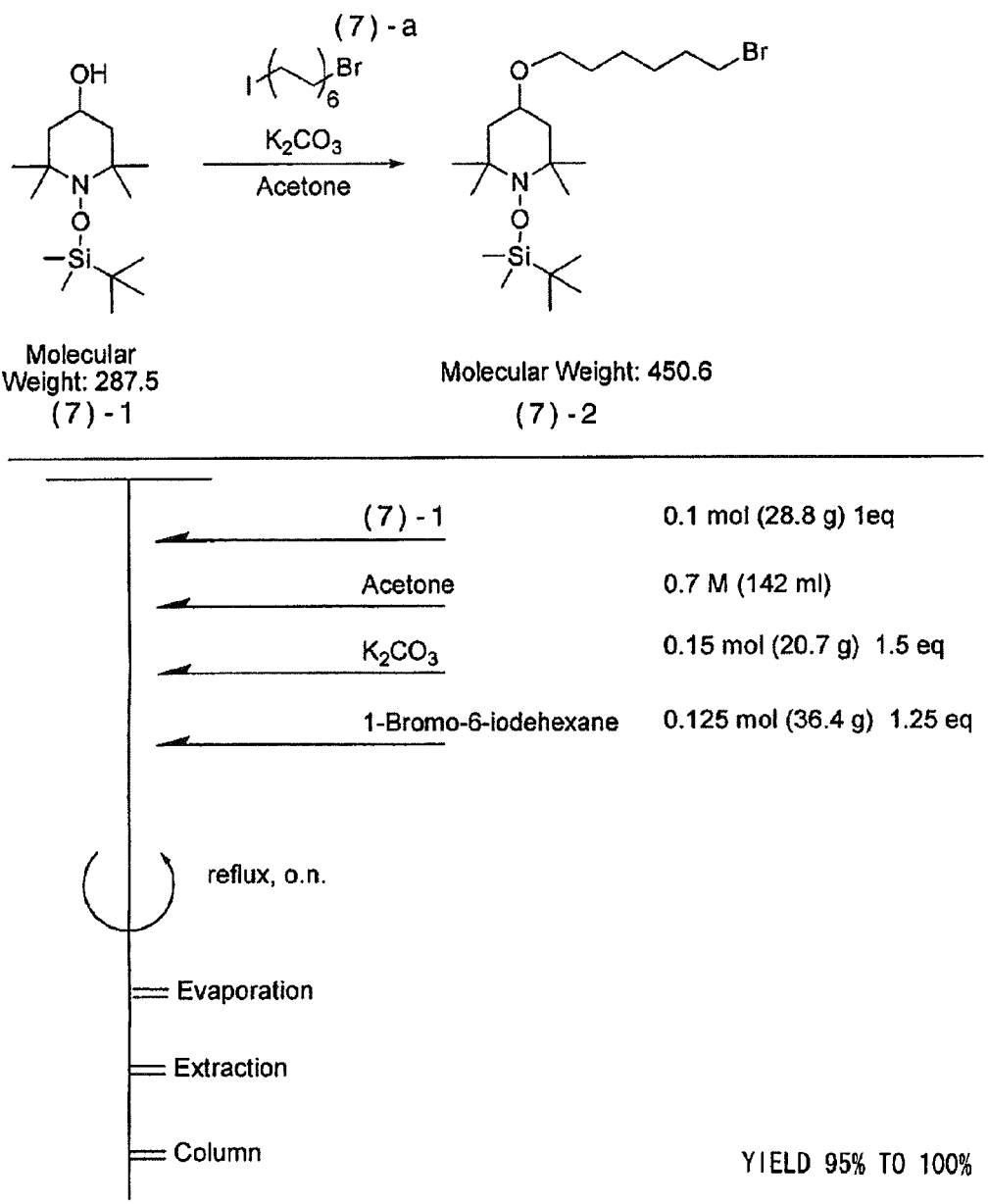
FIG. 10 is an explanatory drawing showing the manufacturing steps for the light-absorbing material shown by Structural Formula (7).

First, as shown in FIG. 10, the compound represented by Structural Formula (7)-1, the compound represented by Structural Formula (7)-a, potassium carbonate and acetone are mixed, and refluxed overnight to obtain the compound represented by Structural Formula (7)-2 (yield 95% to 100%).

Figure 11:
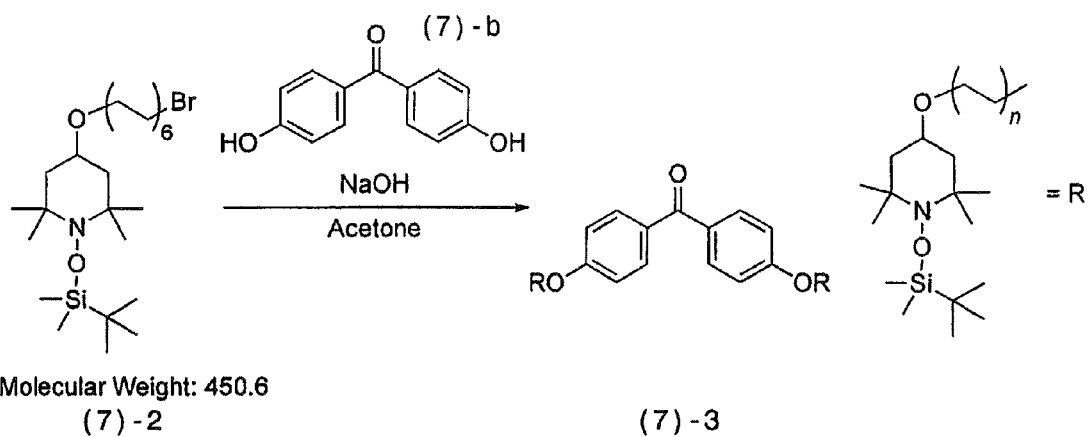
FIG. 11 is an explanatory drawing showing the manufacturing steps for the light-absorbing material shown by Structural Formula (7).

Next, as shown in FIG. 11, the compound represented by Structural Formula (7)-2, the compound represented by Structural Formula (7)-b, sodium hydroxide and acetone are mixed and refluxed overnight to obtain the compound represented by Structural Formula (7)-3 below (yield 95% to 100%).

[C24]

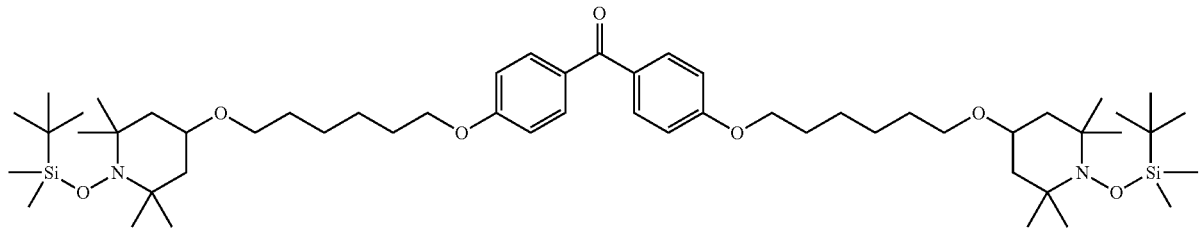

(7)-3

Molecular Weight: 953.5

Figure 12:
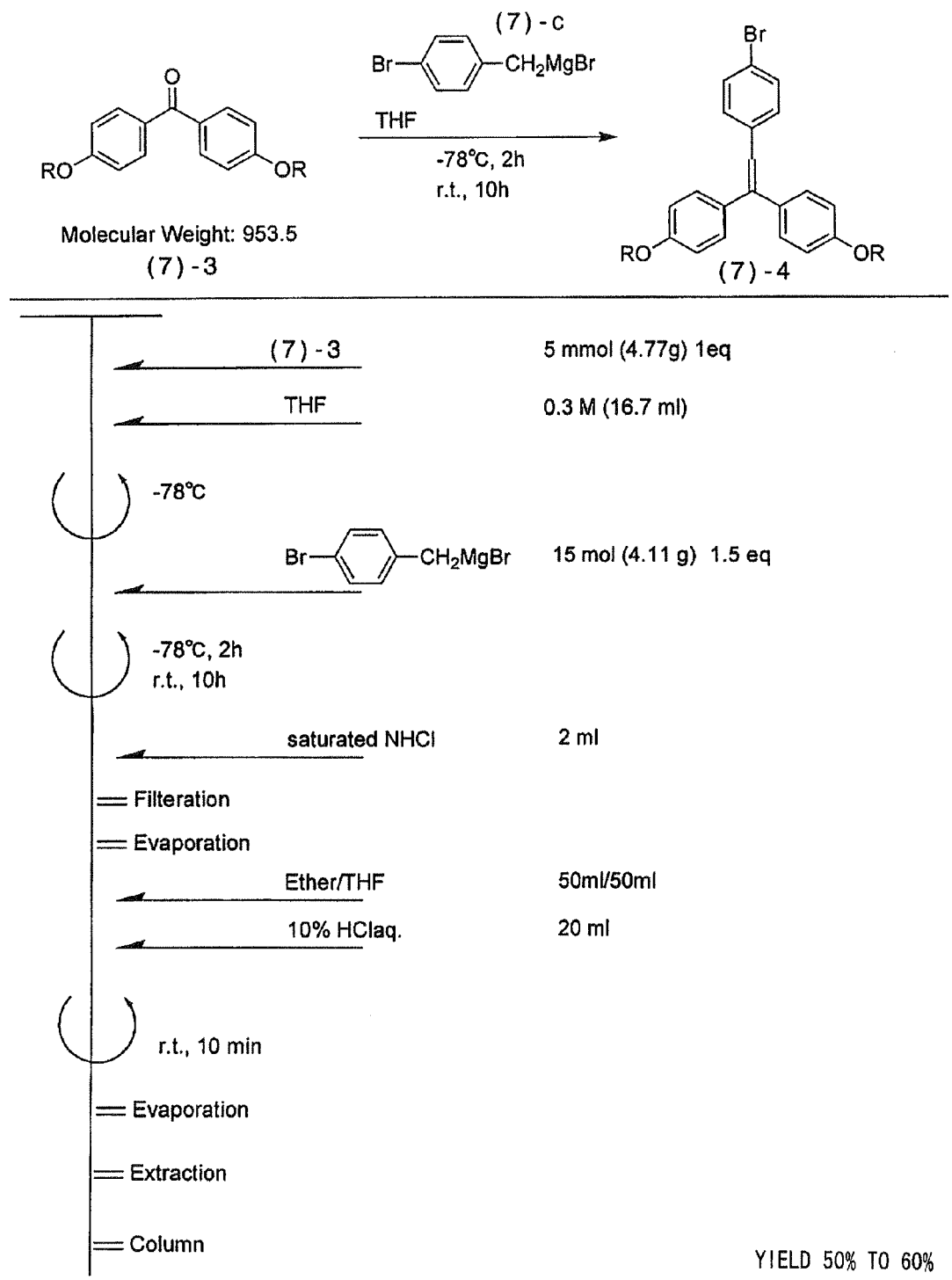
FIG. 12 is an explanatory drawing showing the manufacturing steps for the light-absorbing material shown by Structural Formula (7).

Next, as shown in FIG. 12, the compound represented by Structural Formula (7)-3 and tetrahydrofuran are agitated and mixed at −78° C. The compound represented by Structural Formula (7)-c is added to the resulting mixture, mixed for 2 hours at −78° C., and then agitated and mixed for 10 hours at room temperature. Monochloramine saturated solution, diethyl ether, tetrahydrofuran and 10% aqueous hydrochloride acid solution are added sequentially to the resulting mixture, which is then agitated and mixed for 10 minutes at room temperature to obtain the compound represented by Structural Formula (7)-4 below (yield 50% to 60%).

[C25]

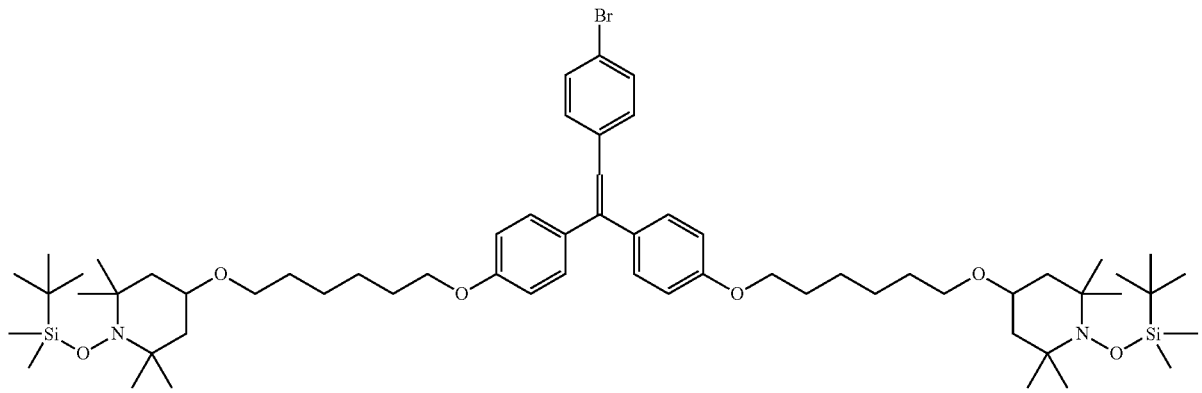

(7)-4

Molecular Weight: 1106.6

Figure 13:
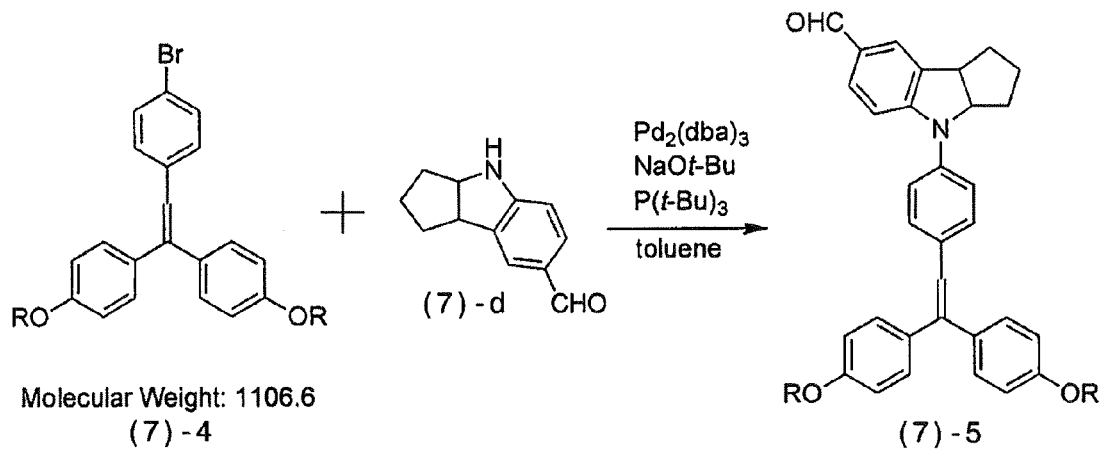
FIG. 13 is an explanatory drawing showing the manufacturing steps for the light-absorbing material shown by Structural Formula (7).

Next, as shown in FIG. 13, the compound represented by Structural Formula (7)-4, the compound represented by Structural Formula (7)-d, tris(dibenzylidenacetone) dipalladium (0), sodium tert-butoxide, tri tert-butylphosphine and toluene are mixed and refluxed overnight to obtain the compound represented by Structural Formula (7)-5 below (yield 50% to 60%).

[C26]

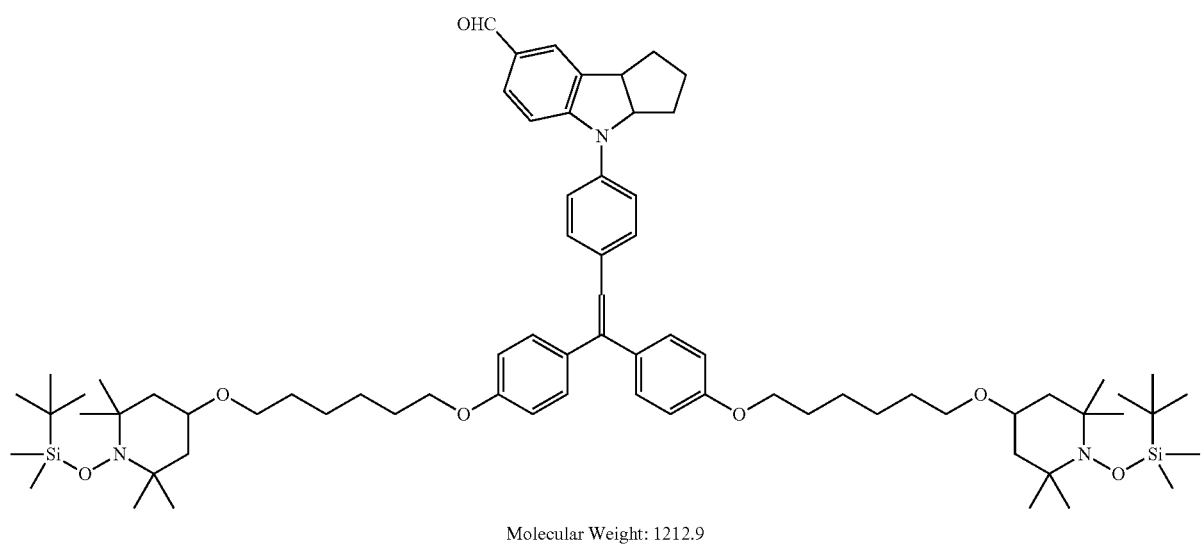

(7)-5

Molecular Weight: 1212.9

Figure 14:
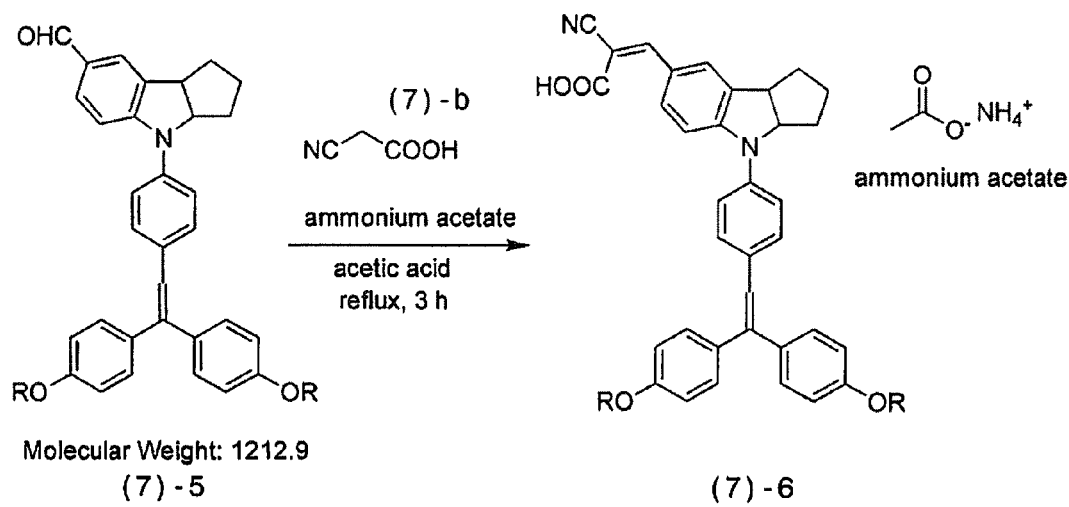
FIG. 14 is an explanatory drawing showing the manufacturing steps for the light-absorbing material shown by Structural Formula (7).
Figure 14:
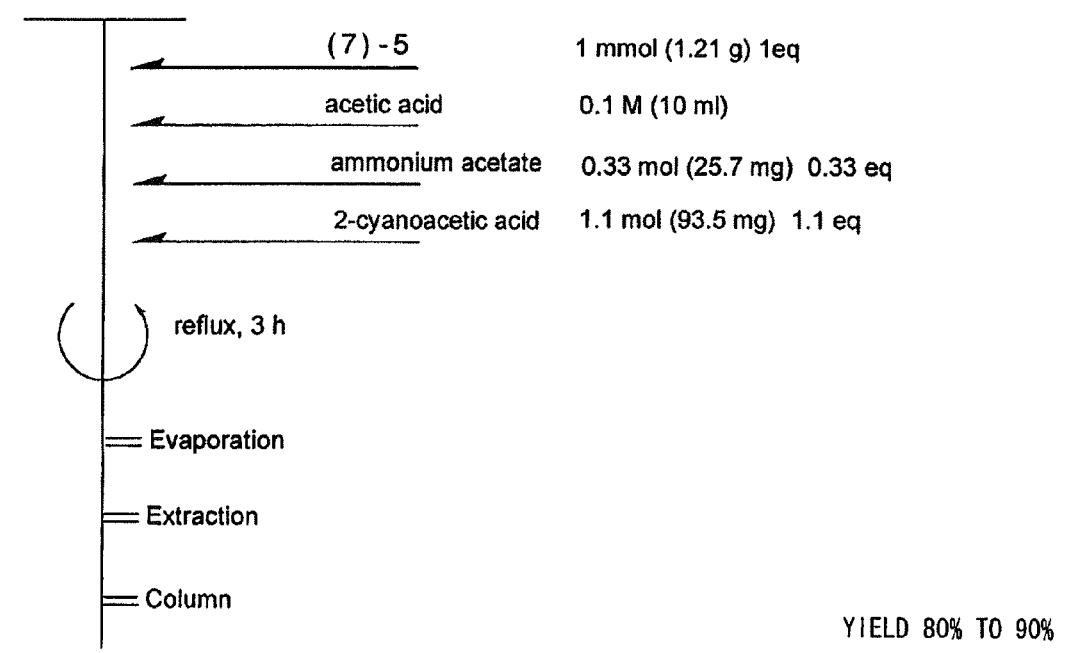

Next, as shown in FIG. 14, the compound represented by Structural Formula (7)-5, the compound represented by Structural Formula (7)-e, ammonium acetate and acetic acid are mixed, and refluxed for 3 hours to obtain the compound represented by Structural Formula (7)-6 below.

[C27]

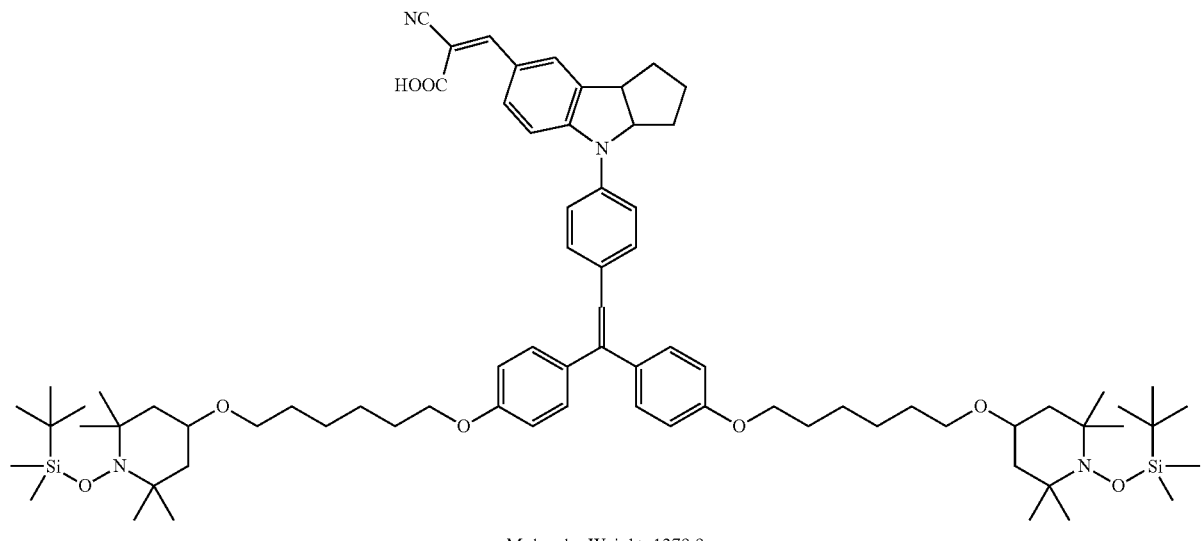

(7)-6

Molecular Weight: 1279.9

Figure 15:
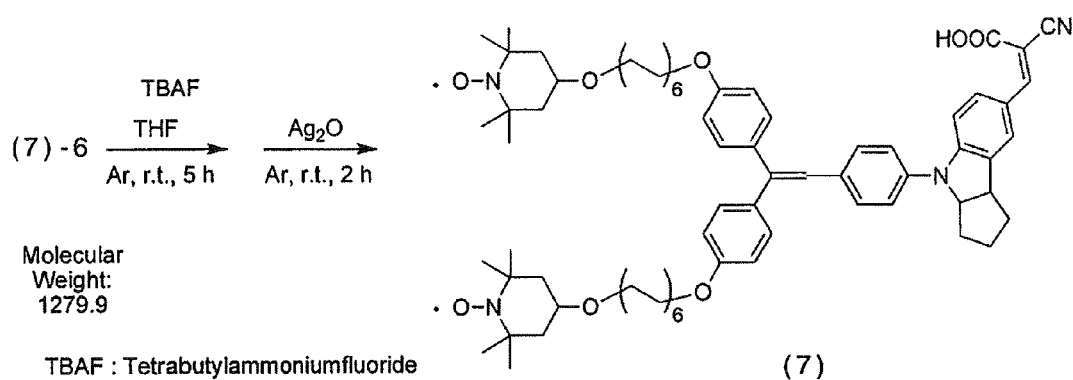
FIG. 15 is an explanatory drawing showing the manufacturing steps for the light-absorbing material shown by Structural Formula (7).
Figure 15:
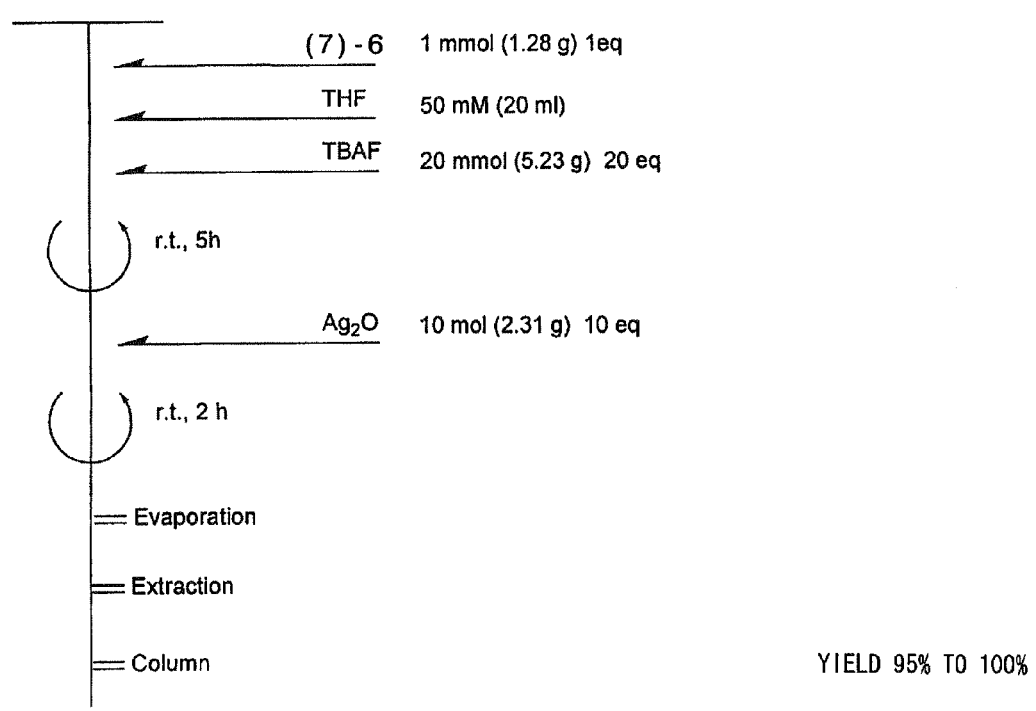

Next, as shown in FIG. 15, the tetra-n-butylammonium fluoride represented by Structural Formula (7)-6 and tetrahydrofuran are agitated and mixed for 5 hours at room temperature in an argon atmosphere. Silver oxide is further added to the resulting mixture, which is then agitated and mixed for 2 hours at room temperature in an argon atmosphere to obtain the compound represented by Structural Formula (7) (yield 95% to 100%).

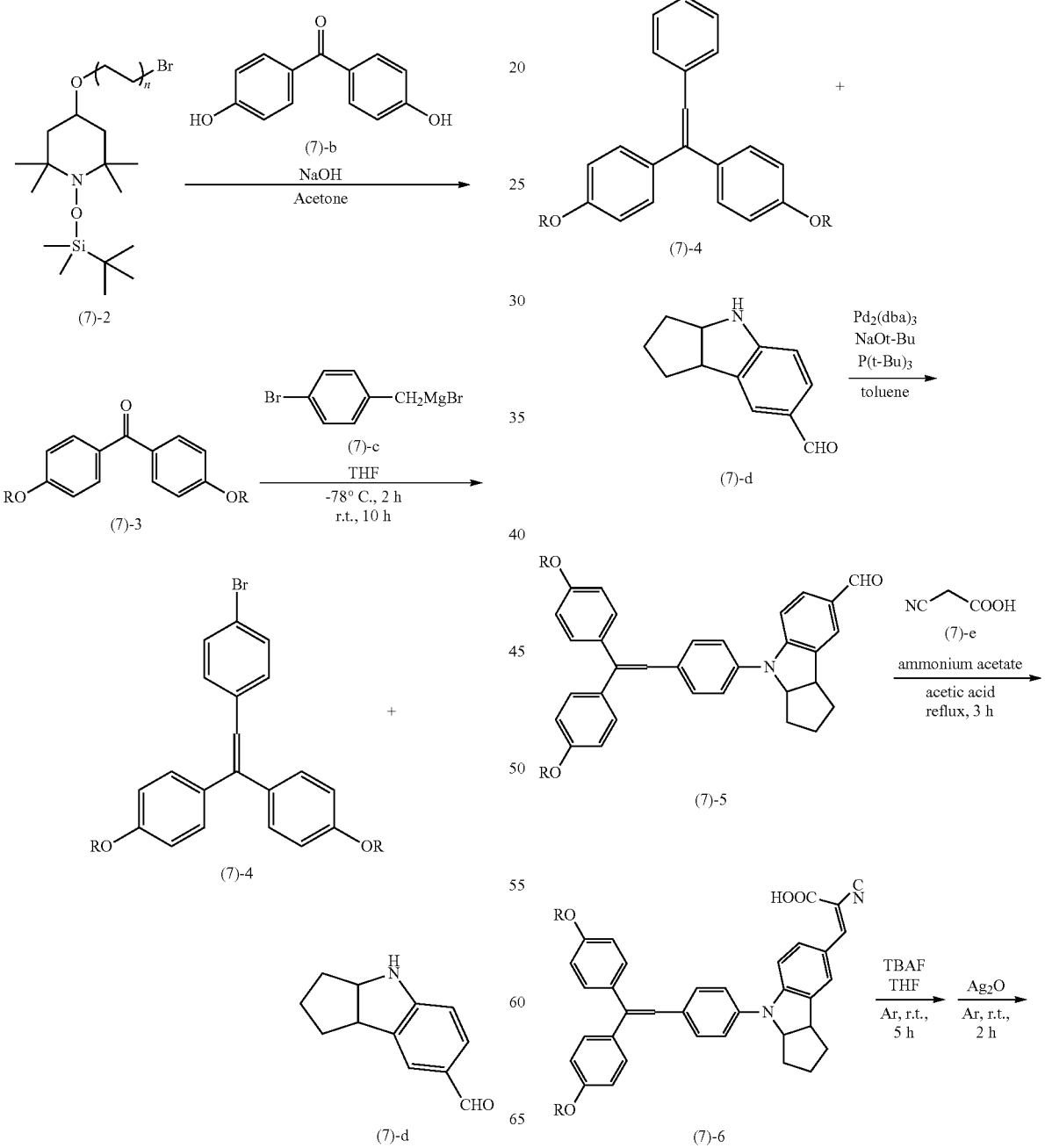

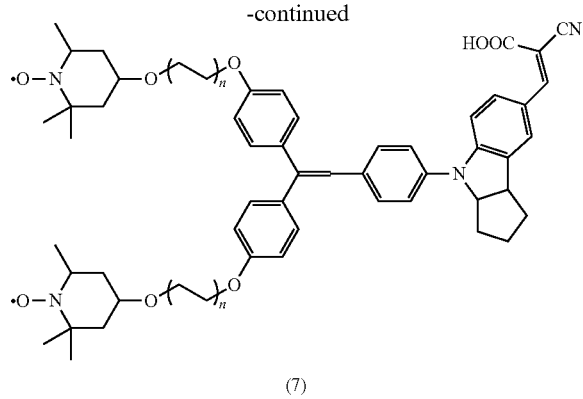

(7)

The light-absorbing material represented by Structural Formula (8) is manufactured by the process shown in [C30] to [C33], and FIGS. 16 to 23.

Figure 16:
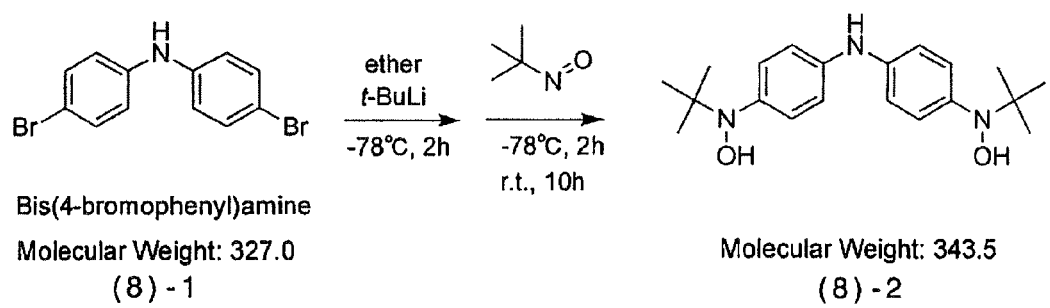
FIG. 16 is an explanatory drawing showing the manufacturing steps for the light-absorbing material shown by Structural Formula (8).
Figure 16:
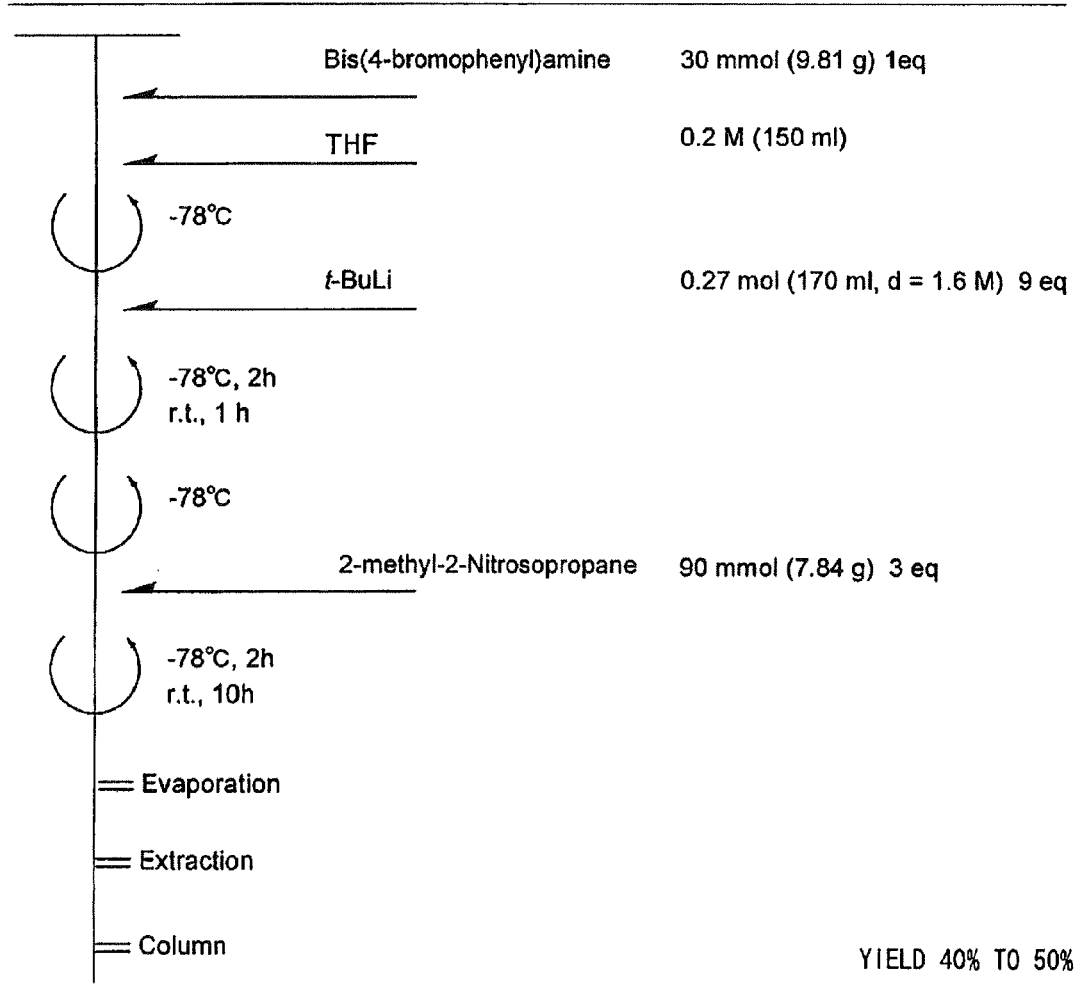

First, as shown in FIG. 16, the compound represented by Structural Formula (8)-1 and diethyl ether are agitated and mixed at −78° C. Tert-butyl lithium is added to the resulting mixture, which is then agitated and mixed for 2 hours at −78° C., and then agitated and mixed for 1 hour at room temperature. 2-methyl-2-nitrosopropane is added to this mixture, which is then agitated and mixed for 2 hours at −78° C. and then agitated and mixed for 1 hour at room temperature to obtain the compound represented by Structural Formula (8)-2 (yield 40% to 50%).

Figure 17:
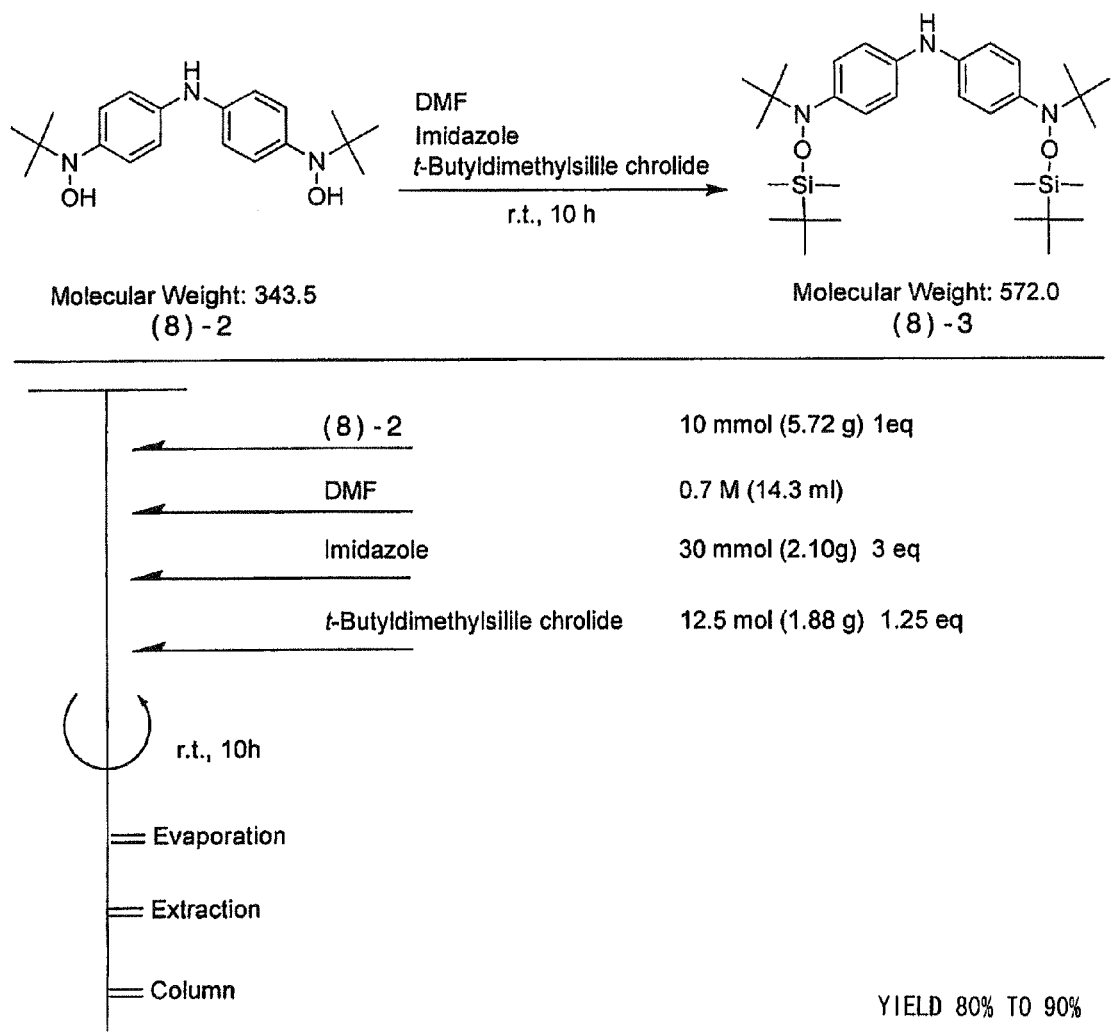
FIG. 17 is an explanatory drawing showing the manufacturing steps for the light-absorbing material shown by Structural Formula (8).

Next, as shown in FIG. 17, the compound represented by Structural Formula (8)-2, N,N-dimethylformamide, imidazole and tert-butyldimethylsilyl chloride are agitated and mixed for 10 hours at room temperature to obtain the compound represented by Structural Formula (8)-3 (yield 80% to 90%).

Figure 18:
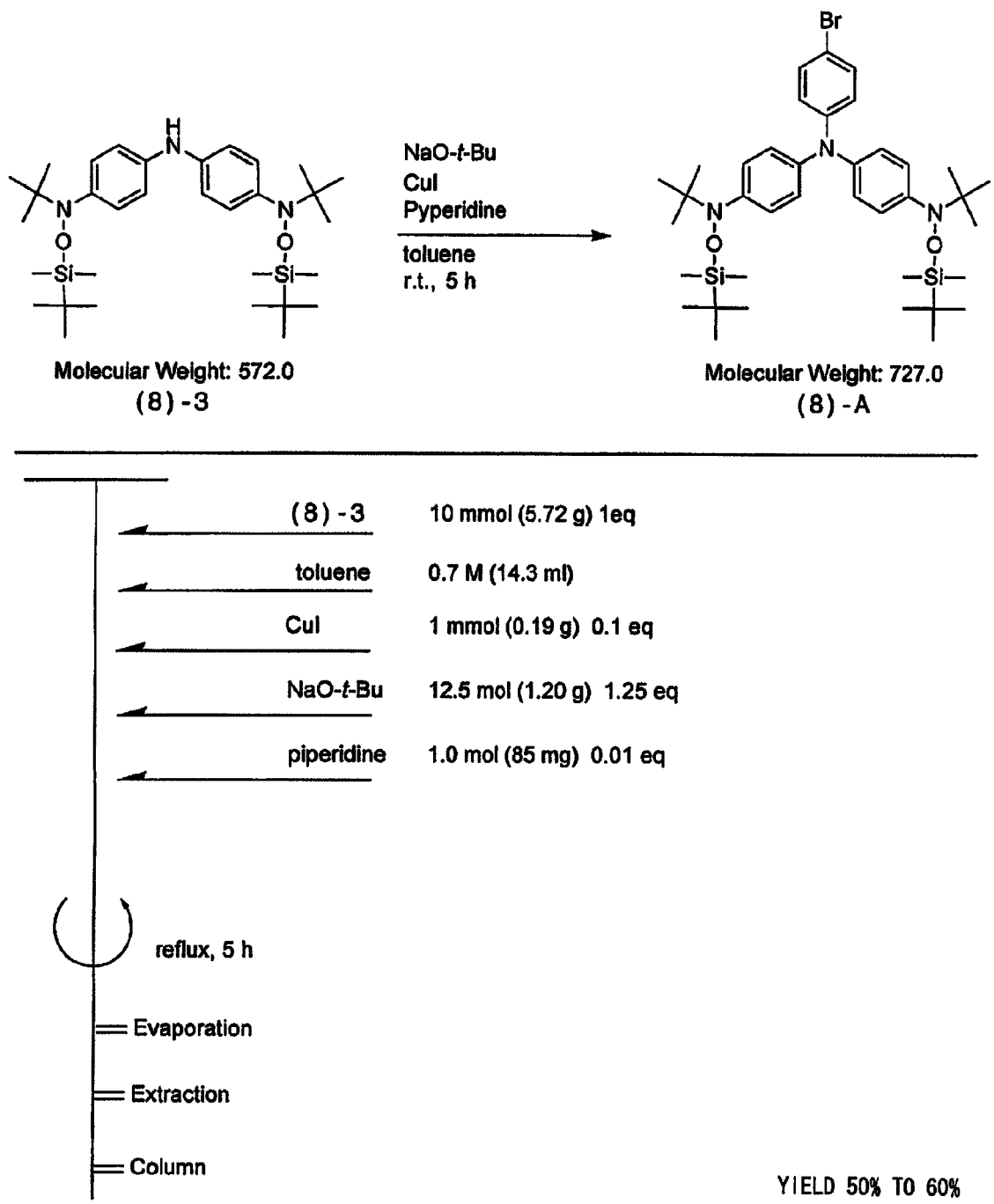
FIG. 18 is an explanatory drawing showing the manufacturing steps for the light-absorbing material shown by Structural Formula (8).

Next, as shown in FIG. 18, the compound represented by Structural Formula (8)-3, toluene, sodium tert-butoxide, copper iodide and piperidine are agitated and mixed, and then refluxed for 5 hours in an argon atmosphere to obtain the compound represented by Structural Formula (8)-A (yield 50% to 60%).

Figure 19:
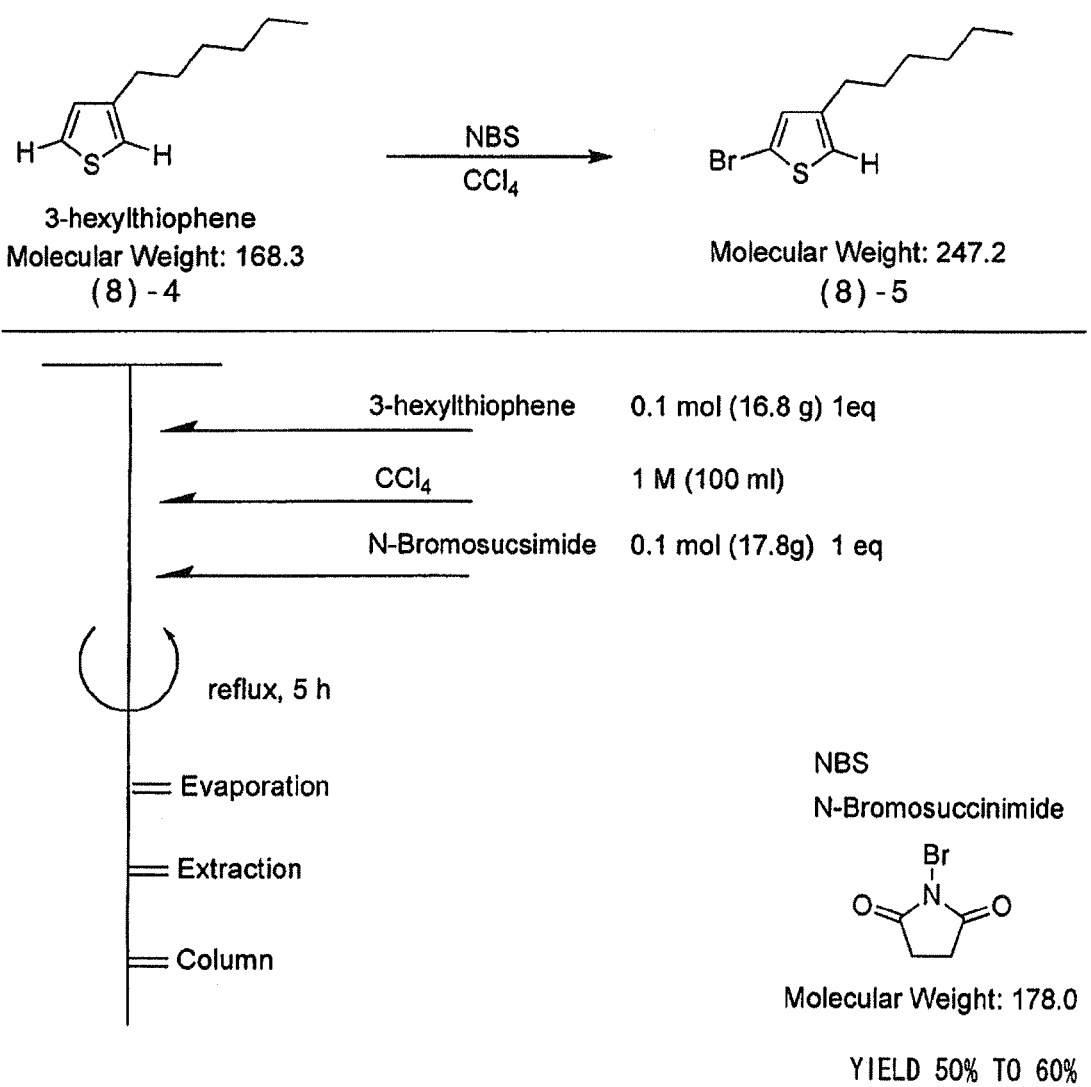
FIG. 19 is an explanatory drawing showing the manufacturing steps for the light-absorbing material shown by Structural Formula (8).

As shown in FIG. 19, the compound represented by Structural Formula (8)-4, carbon tetrachloride and N-bromosuccinimide are agitated and mixed for 5 hours at room temperature to obtain the compound represented by Structural Formula (8)-5 (yield 50% to 60%).

Figure 20:
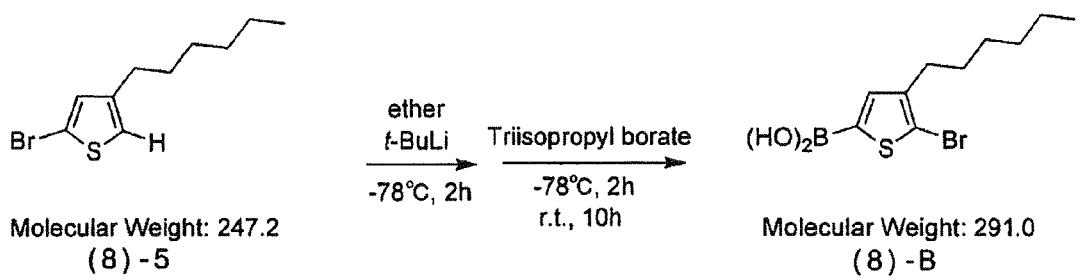
FIG. 20 is an explanatory drawing showing the manufacturing steps for the light-absorbing material shown by Structural Formula (8).
Figure 20:
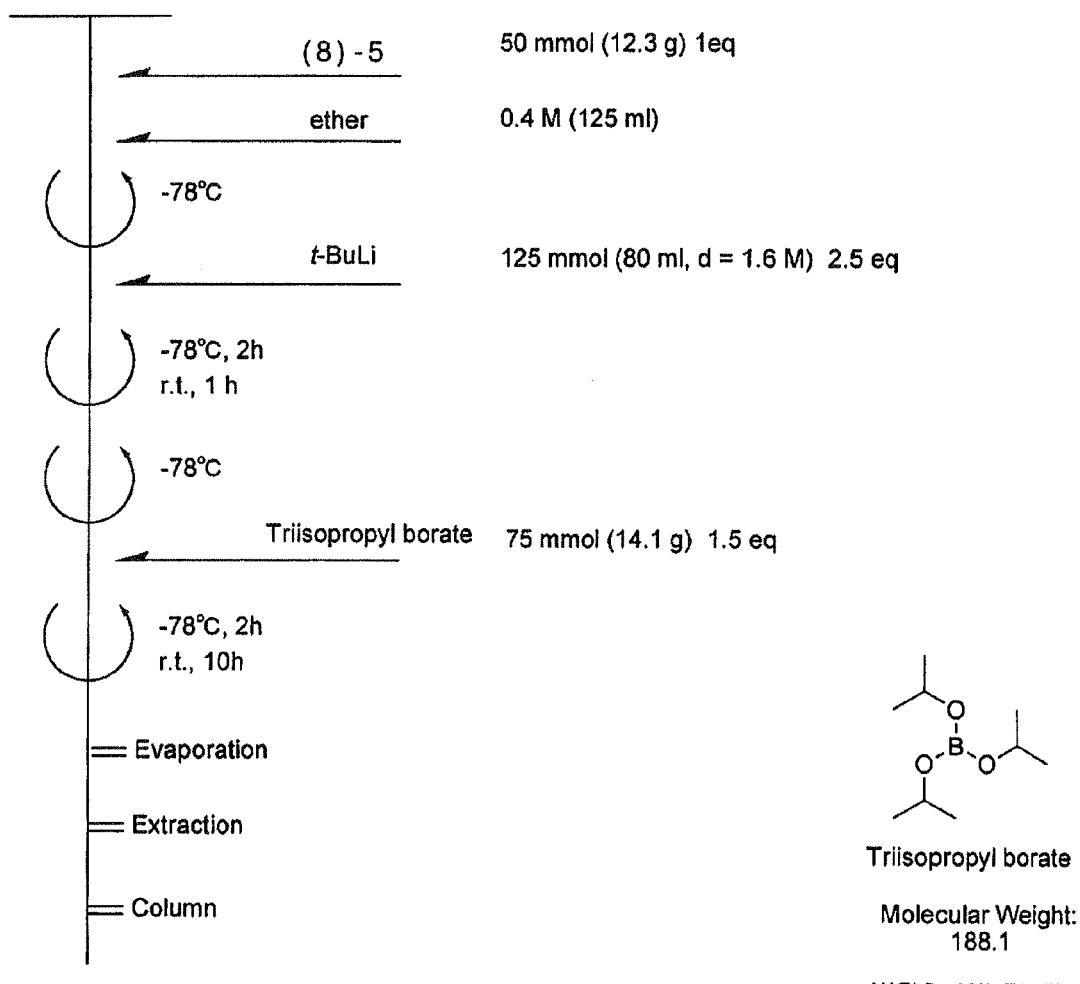

Next, as shown in FIG. 20, the compound represented by Structural Formula (8)-5 and dimethyl ether are agitated and mixed at −78° C. Tert-butyl lithium is added to the resulting mixture, which is agitated and mixed for 2 hours at −78° C., and then agitated and mixed for 1 hour at room temperature. Triisopropyl borate is added to this mixture, which is agitated and mixed for 2 hours at −78° C., and then agitated and mixed for 10 hours at room temperature to obtain the compound represented by Structural Formula (8)-B (yield 40% to 50%).

Figure 21:
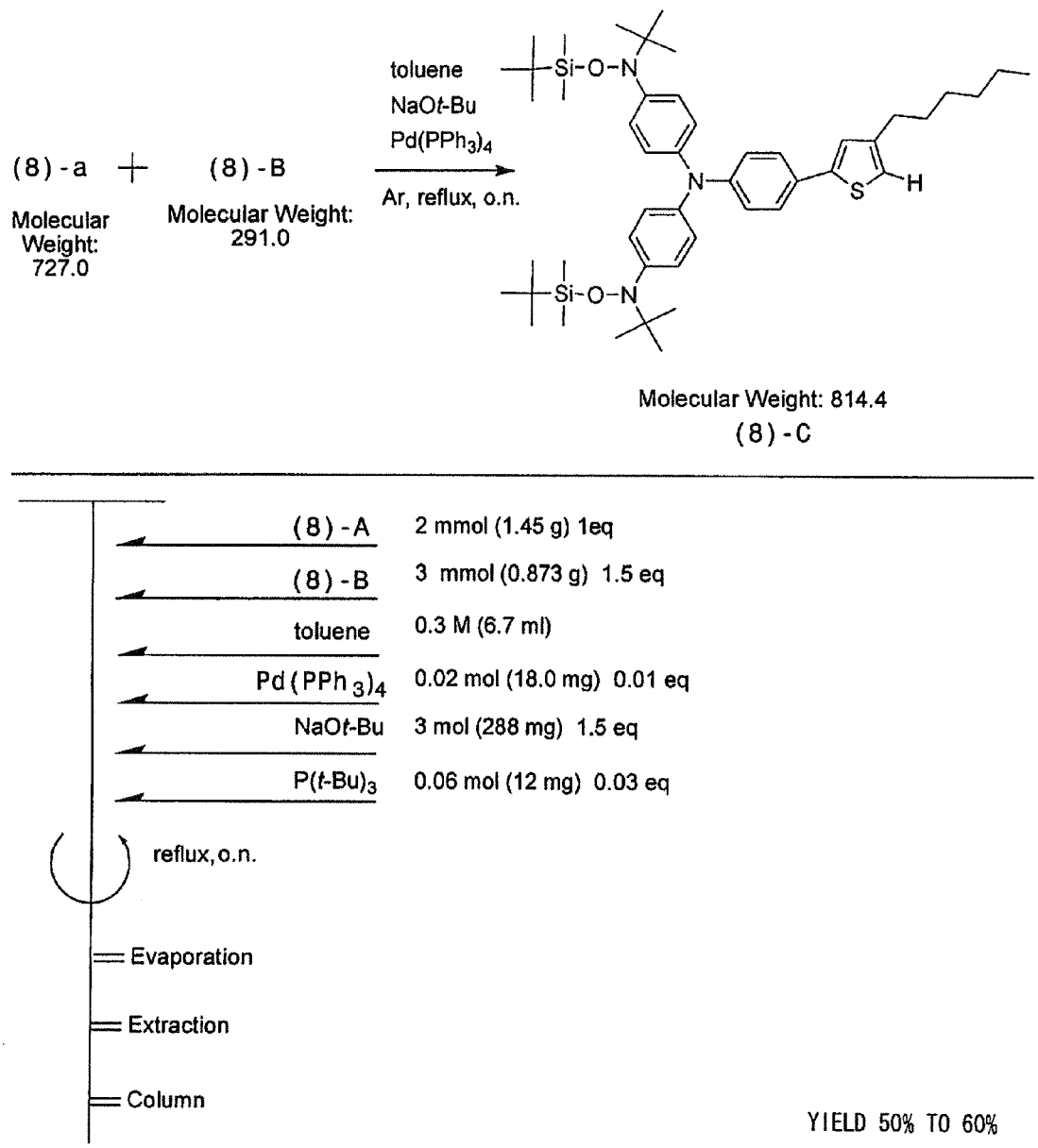
FIG. 21 is an explanatory drawing showing the manufacturing steps for the light-absorbing material shown by Structural Formula (8).

As shown in [C32] and FIG. 21, the compound represented by Structural Formula (8)-A, the compound represented by Structural Formula (8)-B, toluene, sodium tert-butoxide and tetra(triphenylphosphinato) palladium are mixed, and refluxed overnight in an argon atmosphere to obtain the compound represented by Structural Formula (8)-C.

Figure 22:
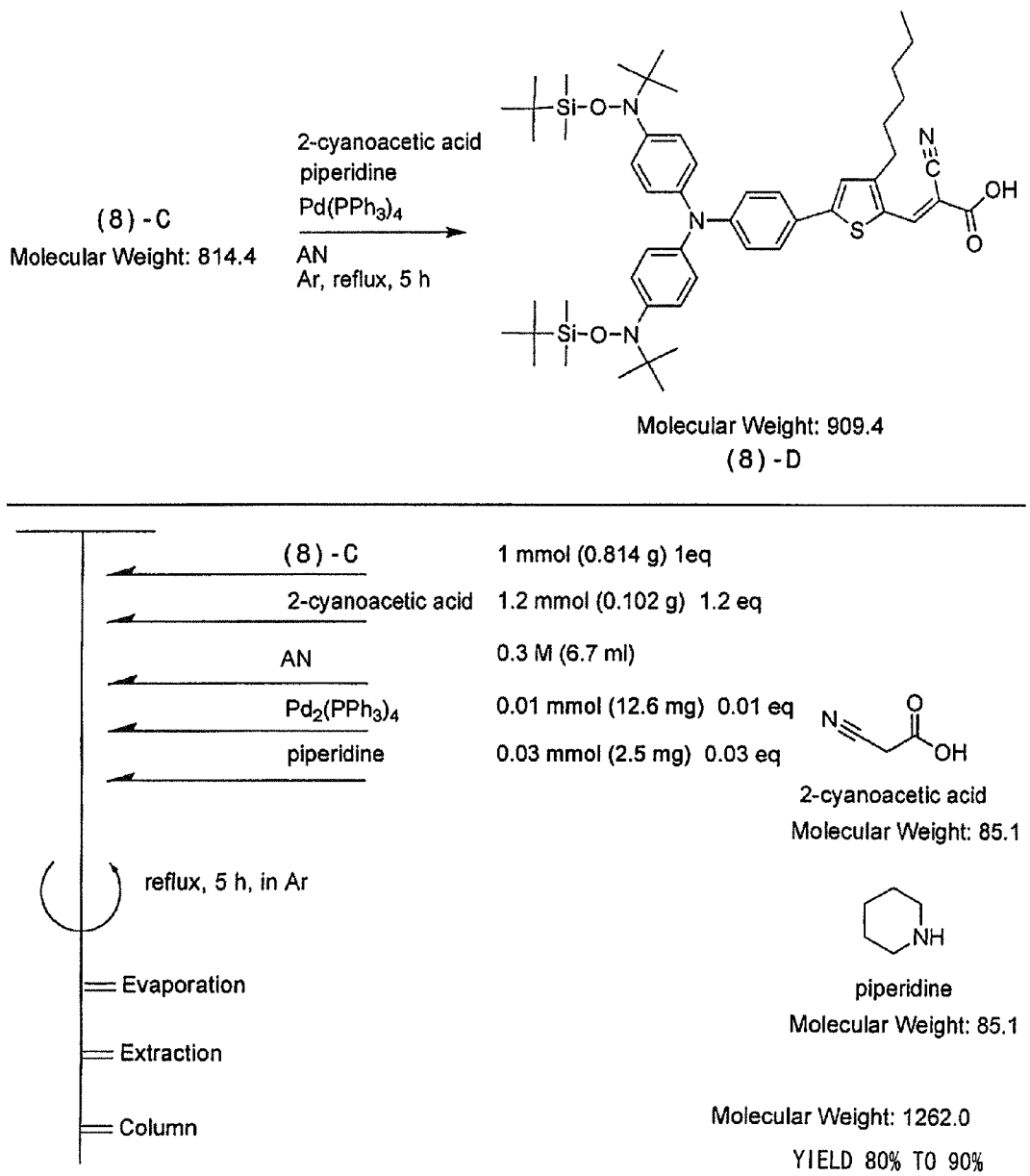
FIG. 22 is an explanatory drawing showing the manufacturing steps for the light-absorbing material shown by Structural Formula (8).

Next, as shown in FIG. 22, the compound represented by Structural Formula (8)-$C_{1-2}$-cyanoacetic acid, acetonitrile (AN), piperidine and tetra(triphenylphosphinato) palladium are mixed, and refluxed for 5 hours in an argon atmosphere to obtain the compound represented by Structural Formula (8)-D (yield 80% to 90%).

Figure 23:
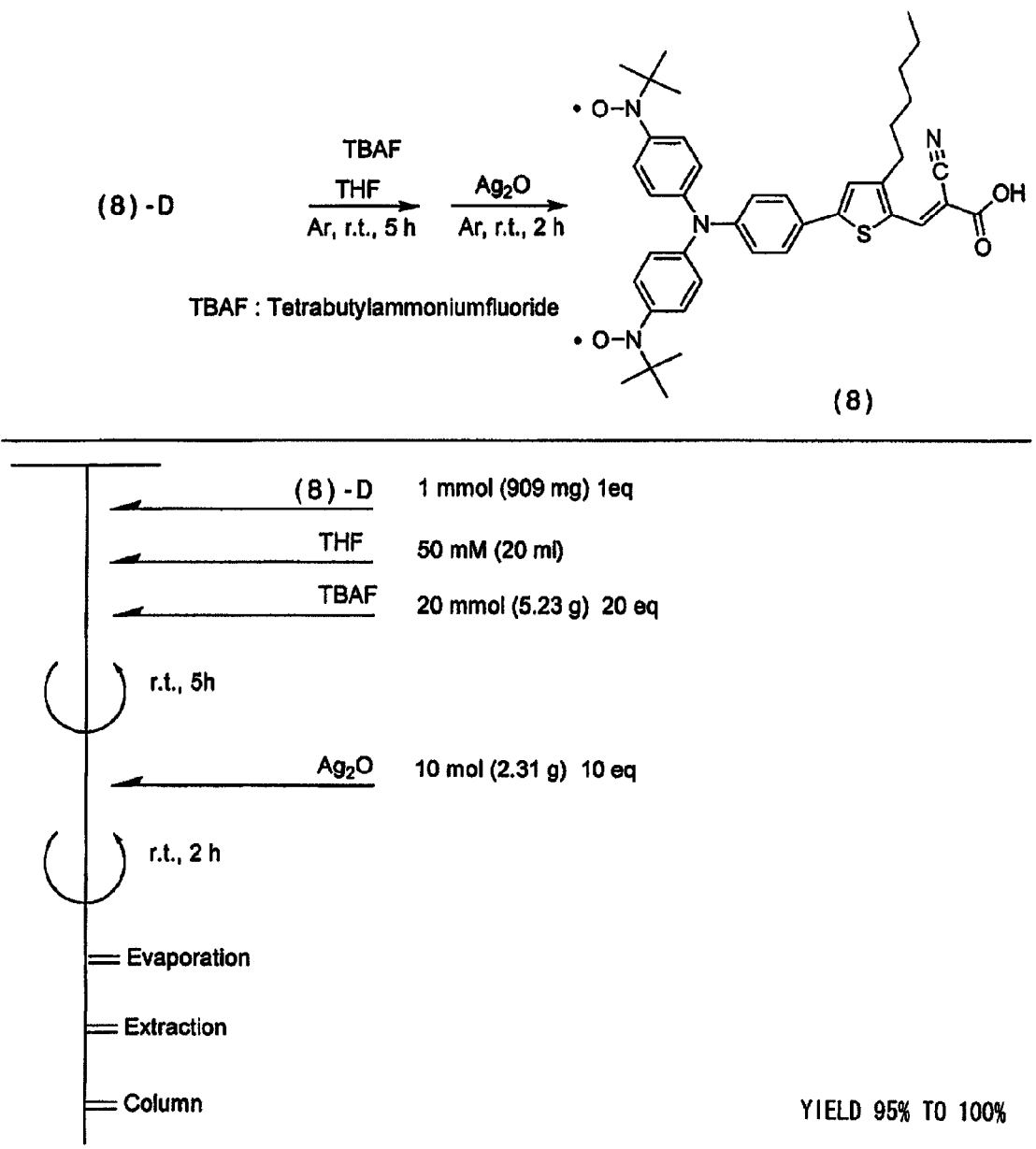
FIG. 23 is an explanatory drawing showing the manufacturing steps for the light-absorbing material shown by Structural Formula (8).

Next, as shown in FIG. 23, the compound represented by Structural Formula (8)-D, tetra-n-butyl ammonium fluoride and tetrahydrofuran are agitated and mixed for 5 hours at room temperature in an argon atmosphere. Silver oxide is added to the resulting mixture, which is then agitated and mixed for 2 hours at room temperature in an argon atmosphere to obtain the compound represented by Structural Formula (8) (yield 95% to 100%).

[C30]

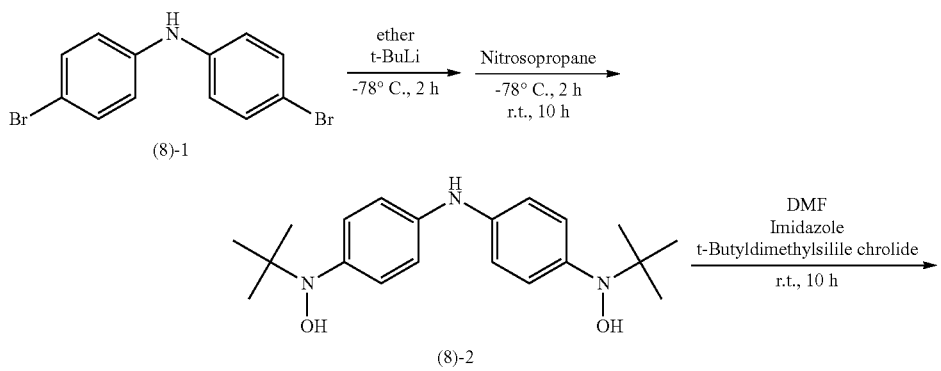

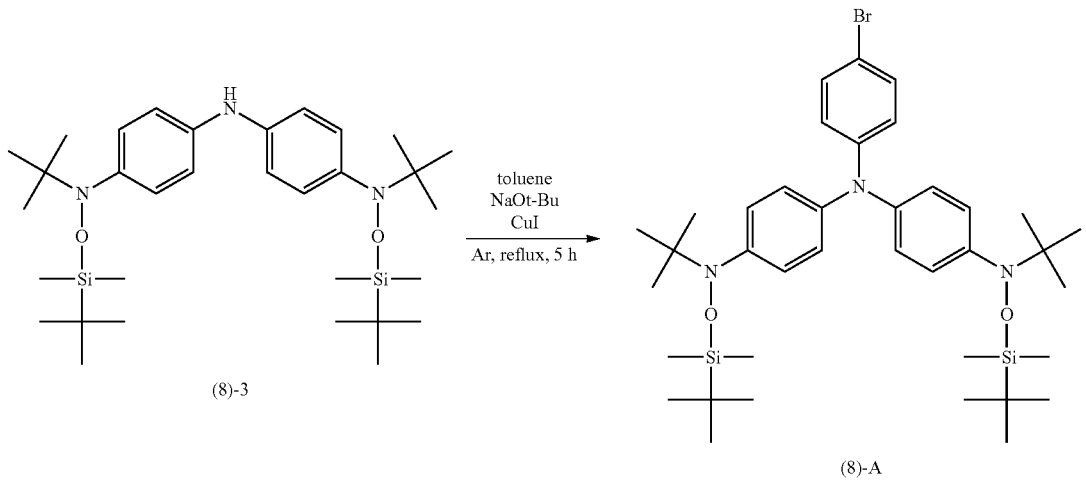
[C31]
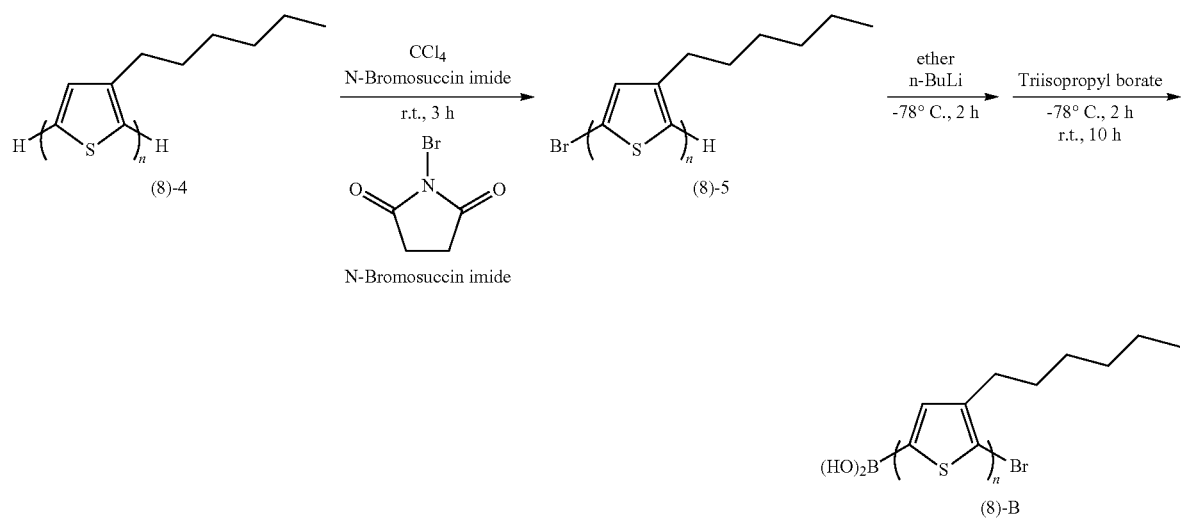
[C32]
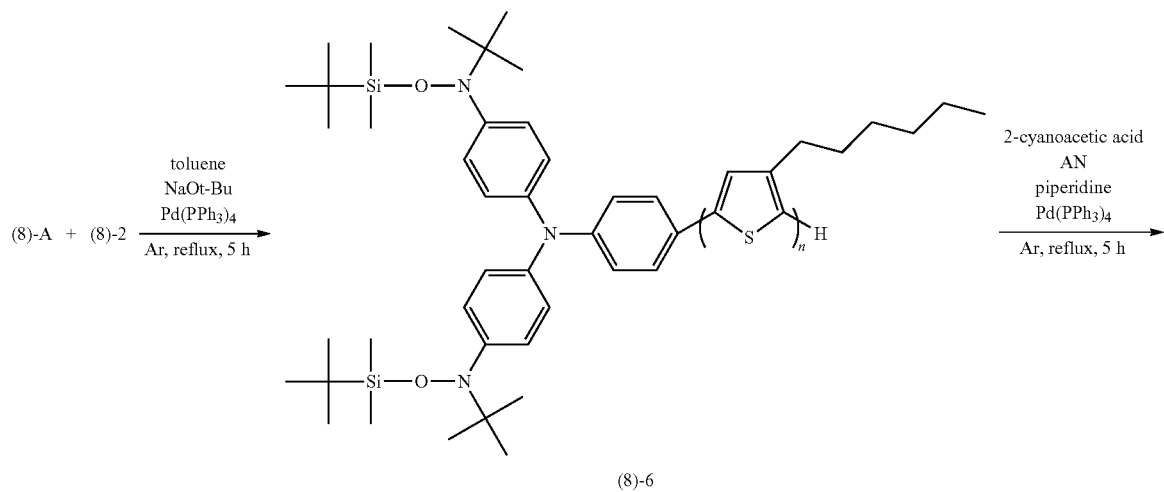

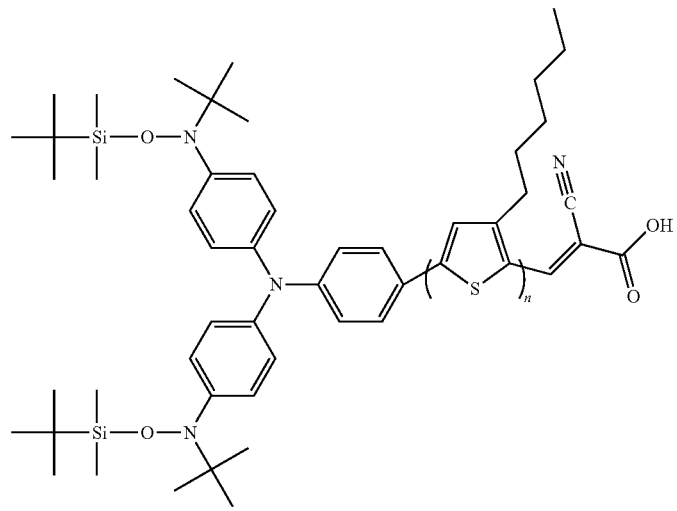
(8)-D
[C33]
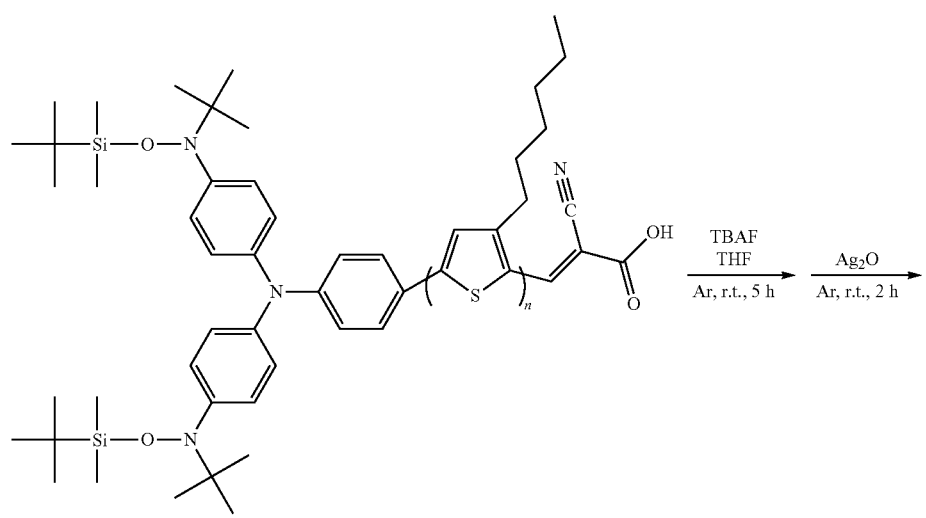
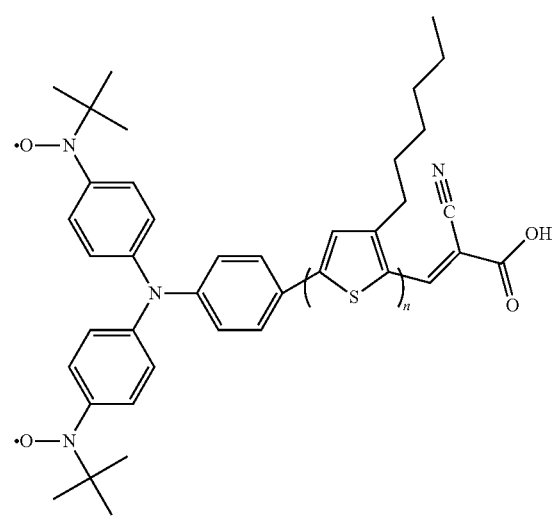

The compound represented by Structural Formula (11) is manufactured by binding fine particles called quantum dots prepared by methods such as those described in Chemistry Letters 2007, Vol. 36, No. 6, page 712 to stable free radicals by methods such as those described in Journal of Molecular Catalysis A: Chemical, 1995, Vol. 101, p. 45.

A light-absorbing material having a radical part Y that acts as an electron receptor for light-absorbing site X is manufactured for example as shown below.

The light-absorbing material represented by Structural Formula (14) is manufactured by the chemical reaction represented by [C34] below for example.

In this reaction, 4,4-bipyridyl is first added to ethanol, 2-bromoethylamine is further added, and the resulting solution is agitated and mixed overnight at 70° C. to obtain the compound represented by Structural Formula (14)-1 as a yellow solid (yield 59%).

Next, the compound represented by Structural Formula (14)-1 and D131 dye are added to a mixed tetrahydrofuran (THF)/ethanol solvent, and the ester condensing agent 4-(4, 6-dimethoxy)-1,3,5-triazine-2-yl)-4-methylmorpholinium chloride (DMT-MM) and a base (triethylamine; TEA) are added. The compound represented by Structural Formula (14)-2 is produced when the resulting solution is left for an hour at room temperature (yield 70%).

The compound represented by Structural Formula (14)-2 is then added to ethanol, and an excess of iodomethane is further added. The resulting solution is left standing overnight at 60° C. and then washed with water, and the product is re-precipitated with diethyl ether. The light-absorbing material represented by Structural Formula (14) is thus obtained as a reddish-brown solid (yield 65%). This light-absorbing material represented by Structural Formula (14) is soluble in chloroform, acetonitrile and methanol, and insoluble in water. The light-absorbing material represented by Structural Formula (14) is identified by 1H-NMR and FAB-Mass.

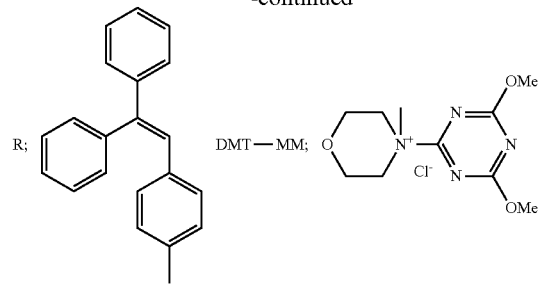

The light-absorbing material represented by Structural Formula (15) is manufactured by the chemical reaction shown in [C35] below.

In this reaction, cyanoacetic acid is dissolved in acetonitrile, and 1-carbonyldiimidazole is further added to activate the carboxyl groups. The viologen derivative represented by Structural Formula (14-1), which is synthesized by the reaction represented by [C30], is further added to construct amide bonds and obtain the compound represented by Structural Formula (15)-1. Production of the compound represented by Structural Formula (15)-1 is confirmed by FAB-Mass. This compound represented by Structural Formula (15)-1 is added to ethanol, and a base and D131 dye are further added to condense the D131 dye with the compound represented by Structural Formula (15)-1 and obtain the light-absorbing material represented by Structural Formula (15).

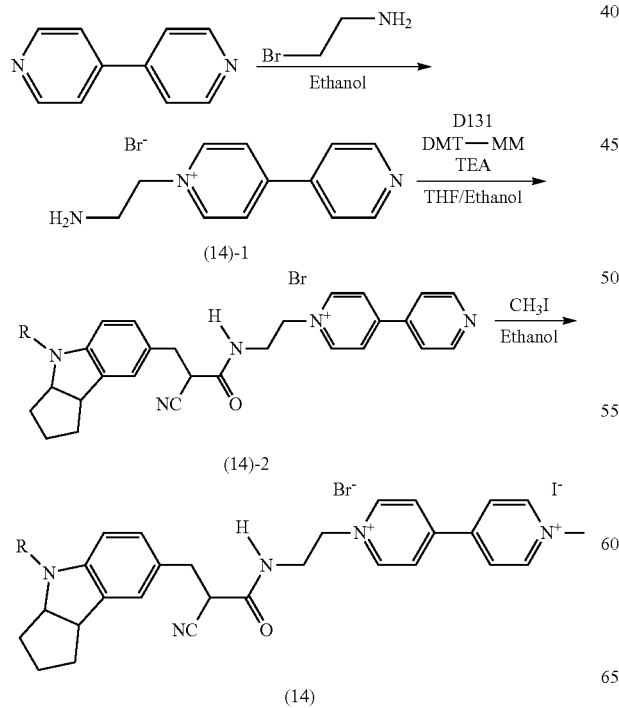

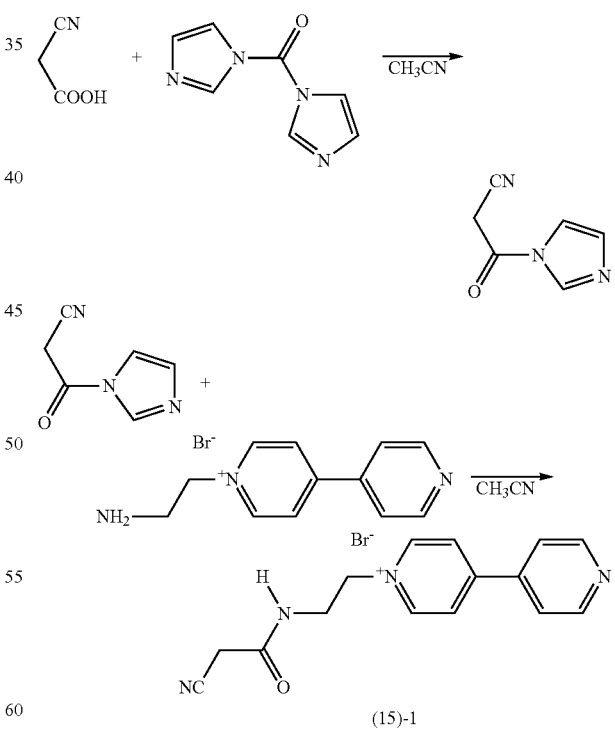

The light-absorbing material represented by Structural Formula (16) is manufactured by the chemical reaction represented by [C36] below.

First, 4,4-bipyridyl and 1-chloro-2,4-dinitrobenzene are added to acetone, and the resulting solution is refluxed for 12 hours to obtain a precipitate. This precipitate is washed with hexane, and vacuum dried to obtain the compound represented by Structural Formula (16)-1 as a gray powder (yield 79%). This compound represented by Structural Formula (16)-1 and 1,4-phenylenediamine are added to ethanol, and the resulting solution is refluxed at boiling point for 12 hours in a nitrogen atmosphere. The solvent is then removed from this solution, and the resulting residue is washed with acetone and then vacuum dried to obtain the compound represented by Structural Formula (16)-2 as a brown powder (yield 92%). This compound represented by Structural Formula (16)-2 is added to methanol, and a condensing agent (DMT-MM) and a base (triethylamine; TEA) are further added to the resulting solution. The compound represented by Structural Formula (16)-3 is produced when this solution is left standing for 1 hour at room temperature (yield 92%). The compound represented by Structural Formula (16)-3 is added to ethanol, and an excess of iodomethane is further added to the resulting solution. This solution is first heated overnight to 60° C., then washed with water, and the product is re-precipitated with diethyl ether to obtain the light-absorbing material represented by Structural Formula (16) as a reddish-brown solid (yield 65%).

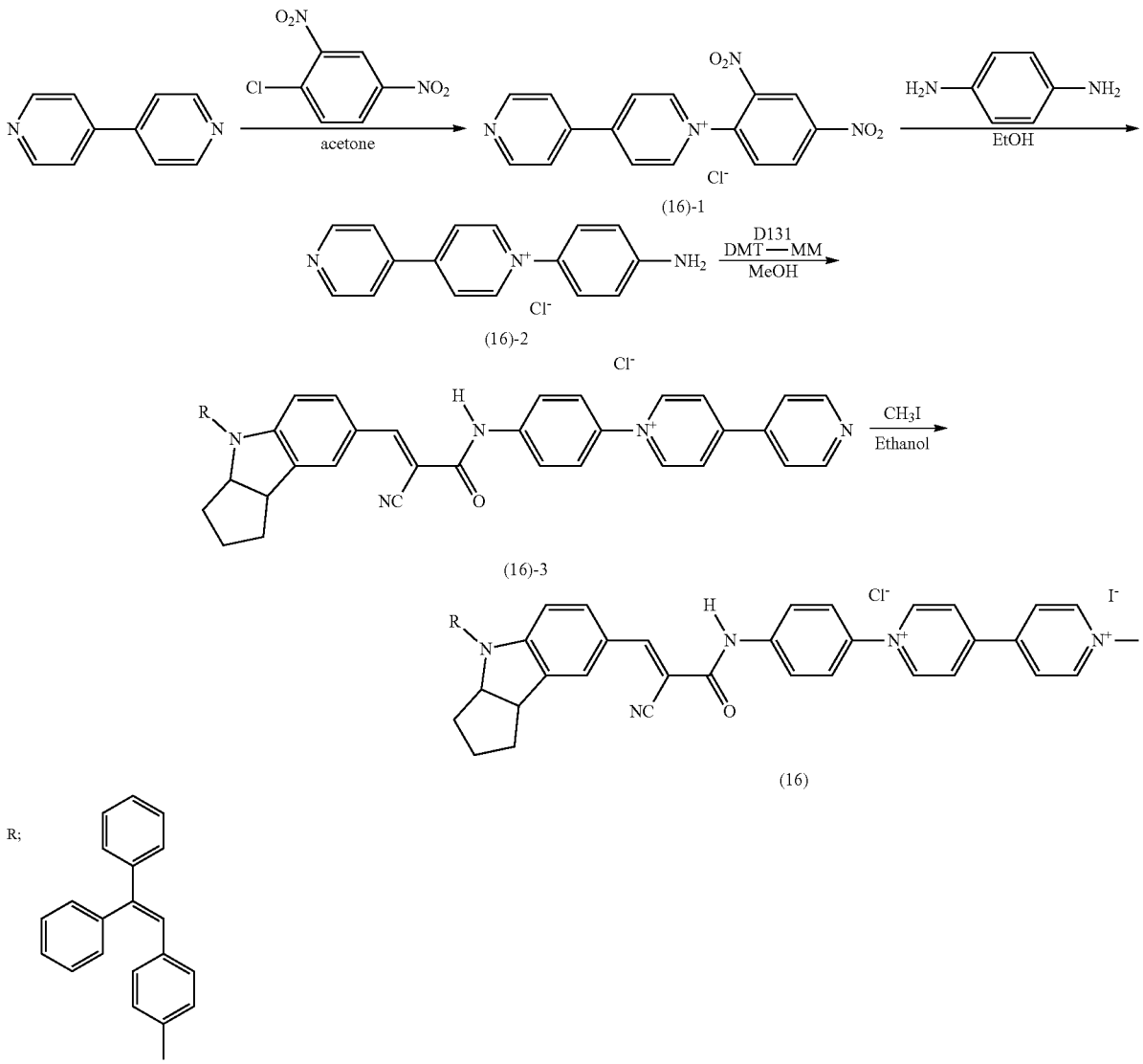

The light-absorbing material represented by Structural Formula (17) is manufactured by the chemical reaction shown by [C37] below.

The compound represented by Structural Formula (17)-1 is produced in a coupling reaction by lithiation of 4-(methoxycarbonyl)phenylboronic acid. PdCl$_2$(PPh$_3$)$_2$, triethylamine, 4,4,5,5-tetramethyl and 1,3,2-dioxaborolane are then added to the compound represented by Structural Formula (17)-1, and the resulting mixture is agitated for 5 hours at 80° C. in toluene in an inactive atmosphere. The compound represented by Structural Formula (17)-2 is then obtained as an orange powder by liquid separation and HPLC purification of this mixture. This compound represented by Structural Formula (17)-2 and MD-22 are added to a mixed benzene/water solvent, and Pd(PPh$_3$), and K$_2$CO$_3$ are further added to the resulting solution, which is then left standing for 12 hours at 50° C. to produce a reaction (Suzuki coupling). The compound represented by Structural Formula (17)-3 is then obtained as a reddish-orange powder by liquid separation and HPLC purification of this solution.

3.15 mg of the compound represented by Structural Formula (17)-3 is added to dichloromethane (3 ml, Kanto Chemical) in an inactive atmosphere, and saturated aqueous sodium hydroxide solution (NaOH content 14.4 mg, Kanto Chemical) is dripped into the resulting solution. This solution is agitated for 30 minutes at room temperature, changing the color of the solution from orange to dark blue. 24 mg of potassium ferricyanate (Kanto Chemical) is added to this solution, which is then agitated for 30 minutes, changing the color of the solution to brown. This solution is then separated and extracted with dichloromethane/water to obtain the light-absorbing material represented by Structural Formula (17).

[C37]

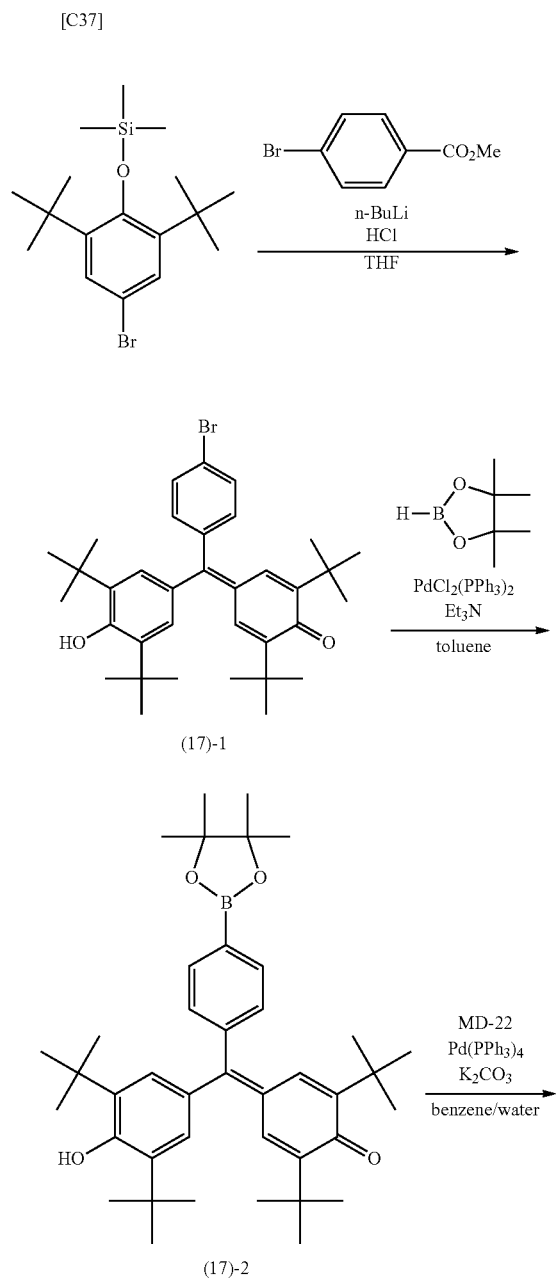

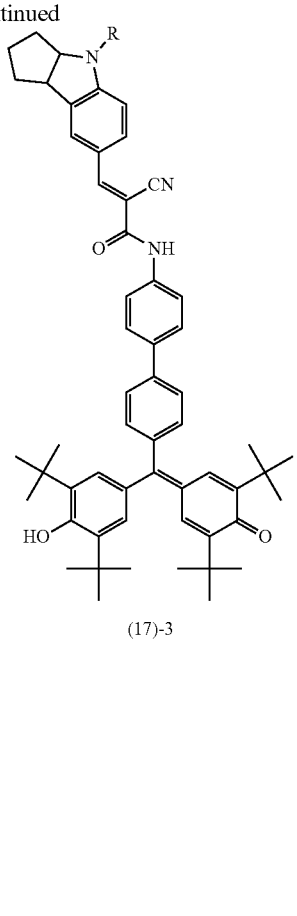

The light-absorbing material is applicable for example to a dye-sensitized or other photoelectric conversion elements such as a light-emitting element or solar cell. The photoelectric conversion element can comprise a charge transport material for transporting holes a charge transport material for transporting electrons, a conductive substrate, and so forth for example.

FIG. 1 is a cross-section showing dye-sensitized solar cell 1 as one example of a photoelectric conversion element. In this dye-sensitized solar cell 1, a layer formed of electron transport material 5 (electron transport layer), a layer formed of light-absorbing material 7, and a layer formed of charge transport material 9 (hole transport layer) are laminated between first substrate electrode 3 and second substrate electrode 11, which are disposed opposite each other.

At least one of first substrate electrode 3 and second substrate electrode 11 has translucency. First substrate electrode 3 and second substrate electrode 11 have electrical conductivity for conducting charge outside the device. The substrate electrode having translucency may be transparent or non-transparent, but is preferably transparent in particular. When second substrate electrode 11 is formed of a metal foil, first substrate electrode 3 is preferably formed of a material with translucency.

First substrate electrode 3 may also comprise a base material formed from glass or a film or the like. In this case, first substrate electrode 3 has a conductive layer laminated on this base material for example. The conductive layer is laminated on the surface of the base material that faces electron transport material 5. The conductive layer is formed for example of indium or another metal; carbon; indium-tin composite oxide, antimony-doped tin oxide, fluorine-doped tin oxide or other conductive metal oxide; or a complex obtained by complexing these compounds. First substrate electrode 3 may also comprise a layer formed of a compound such as those described above, coated with a layer formed of silicon oxide, tin oxide, titanium oxide, zirconium oxide, aluminum oxide or the like. First substrate electrode 3 is formed by a dry process such as vapor deposition or sputtering, or a wet process such as dipping, spray thermal decomposition, CVD or the like.

When light passes through second substrate electrode 11 to enter the photoelectric conversion element, first substrate electrode 3 may be provided with a film formed of titanium, nickel, zinc, stainless steel or other metal foil.

Second substrate electrode 11 functions as the negative electrode of the photoelectric conversion element. Second substrate electrode 11 is formed only of metal for example. Second substrate electrode 11 may also comprise a film and a conductive layer laminated on this film. This conductive layer contacts the layer formed of charge transport material 9.

The conductive layer in second substrate electrode 11 is formed of the same material as the conductive layer in first substrate electrode 3 for example. The conductive layer in second substrate electrode 11 is formed for example from a metal such as platinum, gold, silver, copper, aluminum, rhodium or indium; a carbon material such as graphite, carbon nanotubes or platinum-carrying carbon; a conductive metal oxide such as an indium-tin composite oxide, antimony-doped tin oxide, fluorine-doped tin oxide or the like; or a conductive polymer such as polyethylene dioxythiophene, polypyrrole, polyaniline or the like. When charge transport material 9 is an electrolyte solution, it is particularly desirable that second substrate electrode 11 be formed of platinum, graphite, polyethylene dioxythiophene or the like.

The surface resistance of first substrate electrode 3 and second substrate electrode 11 is preferably as low as possible. The surface resistance of first substrate electrode 3 and second substrate electrode 11 is preferably 200 Ω/sq. or less, or more preferably 50 Ω/sq. or less. There is no particular lower limit on the surface resistance of first substrate electrode 3 and second substrate electrode 11 but 0.1 Ω/sq. is normal.

Light transmittance is preferably as high as possible in at least one of first substrate electrode 3 and second substrate electrode 11. The light transmittance of the substrate electrode with high light transmittance is preferably 50% or more, or more preferably 80% or more.

The thicknesses of the conductive layers in first substrate electrode 3 and second substrate electrode 11 is preferably in the range of 0.1 μm to 10 μm. Within this range, it is easy to form a conductive layer with a uniform thickness, while maintaining the high light transmittance of the conductive layer.

Electron transport material 5 is not limited as long as in which electrons are carriers. Examples of semiconductor materials that can be used as electron transport material 5 include oxides of Cd, Zn, In, Pb, Mo, W, Sb, Bi, Cu, Hg, Ti, Ag, Mn, Fe, V, Sn, Zr, Sr, Ga, Si, Cr and other metal elements; $SrTiO_3$, $CaTiO_3$ and other metal oxides having perovskite structures; CdS, ZnS, $In_2S_3$, PbS, $Mo_2S$, $WS_2$, $Sb_2S_3$, $Bi_2S_3$, $ZnCdS_2$, $Cu_2S$ and other sulfides, CdSe, $In_2Se_3$, $WSe_2$, HgS, PbSe, CdTe and other metal chalcogenides; and GaAs, Si, Se, $Cd_2P_3$, $Zn_2P_3$, InP, AgBr, $PbI_2$, $HgI_2$, BiI, and the like.

Electron transport material 5 may also be a complex containing at least one or more selected from semiconductor materials such as those described above. Examples of such complexes include $CdS/TiO_2$, CdS/AgI, $Ag_2S/AgI$, CdS/ZnO, CdS/HgS, CdS/PbS, ZnO/ZnS, ZnO/ZnSe, CdS/HgS, CdS/CdSe, CdS/Te, CdSe/Te, ZnS/CdSe, ZnSe/CdSe, CdS/ZnS, $TiO_2/Cd_3P_2$, CdS/CdSe/CdZnS, CdS/HgS/CdS and the like.

Electron transport material 5 may also be C60 or a redox polymer having an oxidizing-reducing side chain or a polythiophene, polyaniline or other conductive polymer that can be made into an n-type semiconductor by doping.

Electron transport material 5 may also be a polyradical compound that is an n-type semiconductor and has stable oxidative-reductive behavior, as disclosed in Japanese Patent Application Laid-open No. 2008-280400.

For example, when electron transport material 5 is a semiconductor material, the molecular density of the light-absorbing material relative to the projected area of the photoelectric conversion element depends partly on the light-absorbing efficiency of light-absorbing material 7, but is preferably in the range of $1\times10^{-8}$ mol/cm$^2$ to $1\times10^{-6}$ mol/cm$^2$ from the standpoint of the output characteristics. If the density of light-absorbing material 7 is above this range, the amount of light-absorbing material 7 is too great relative to the amount of incident light, so that much of light-absorbing material 7 performs no function. If the density of light-absorbing material 7 is below this range, on the other hand, insufficient light will be absorbed by light-absorbing material 7. When the photoelectric conversion element is an entirely translucent "see-through" type element, however, the density and absolute amount of light-absorbing material 7 may be reduced in accordance with the desired light transmittance of the photoelectric conversion element. Also, the photoelectric conversion efficiency of the photoelectric conversion element is improved when the layer formed of electron transport material 5 is a porous layer, and the ratio of effective area to projected area is 1 or more. The upper limit on the ratio of effective area to projected area is not particularly limited in the layer formed of electron transport material 5, but is preferably 1 million or less.

Charge transport material (hole transport material) 9 may be a substance that produces redox pairs. Iodine is often used as such a charge transport material 9, but this is not a limitation.

For example, charge transport material 9 may be a stably oxidized and reduced radical compound such as that described in Japanese Patent Application Laid-open No. 2003-100360. This is desirable in particular because it promotes the reduction reaction of the oxidized radical site when radical site Y in light-absorbing material 7 is an electron donor, resulting in rapid reduction of radical site Y.

Charge transport material 9 may also be an electrolyte solution. In charge transport material 9, the solvent used to dissolve the electrolyte is preferably a compound with superior ion conductivity, capable of dissolving the component substances of the redox system. The solvent may be an aqueous solvent or organic solvent, but is preferably an organic solvent in order to further stabilize the components of the redox system in the electrolyte solution. Examples of the organic solvent include dimethyl carbonate, diethyl carbonate, methylethyl carbonate, ethylene carbonate, propylene carbonate and other carbonate compounds; methyl acetate, methyl propionate, γ-butyrolactone and other ester compounds; diethyl ether, 1,2-dimethoxyethane, 1,3-dioxosilane, tetrahydrofuran, 2-methyl-tetrahydrofuran and other ether compounds; 3-methyl-2-oxazolidinone, 2-methylpyrrolidone and other heterocyclic compounds; acetonitrile, methoxyacetonitrile, propionitrile and other nitrile compounds; and sulfolane, dimethyl sulfoxide, dimethyl formamide and other aprotic polar compounds and the like. One of these solvents can be used, or two or more may be combined. It is particularly desirable to use ethylene carbonate, propylene carbonate or another carbonate compound; γ-butyrolactone, 3-methyl-2-oxazolidinone, 2-methylpyrrolidone or another heterocyclic compound; acetonitrile, methoxyacetonitrile, propionitrile, 3-methoxypropionitrile, valeric acid nitrile or another nitrile compound; or ethylene glycol, polyethylene glycol, polyethylene or another polyol compound or the like as the organic solvent. Charge transport material 9 may also be made into a gel by including an oil-gel system, a polyvinylidene fluoride polymer compound or other polymer matrix, a liquid crystal gel, an amino acid derivative or other low-molecular compound, or silica particles or other inorganic particles or the like.

When charge transport material 9 contains a volatile component, it is effective to seal charge transport material 9. If it can become a p-type semiconductor when doped, charge transport material 9 may also be a conductive polymer such as polythiophene or polyaniline, or a polymer having easily oxidizable/reducible side chains. In this case, liquid seepage is controlled because the layer formed of charge transport material 9 is a solid or gel, and therefore the photoelectric conversion efficiency of the photoelectric conversion element can be maintained at a high level long-term.

The redox potential of radical site Y and the redox potential of the hole transport material or electron transport material are preferably adjusted so as to smoothly promote charge separation. For example, when radical site Y in the light-absorbing material 7 is an electron donor, charge separation proceeds smoothly in light-absorbing material 7 if the redox potential of the hole transport material 9 is lower than the redox potential of radical site Y. When radical site Y has a structure such as those given as examples in this Description, this potential adjustment can be achieved with relative ease by introducing functional groups into radical site Y or otherwise changing the molecular structure of radical site Y.

In a photoelectric conversion element configured in this way, radical site Y promotes an oxidation or reduction reaction of light-absorbing site X during the photoelectric conversion process that occurs when light-absorbing site X absorbs light, thereby causing rapid charge separation while controlling charge recombination. This enhances the photoelectric conversion of the photoelectric conversion element.

Figure 2A:
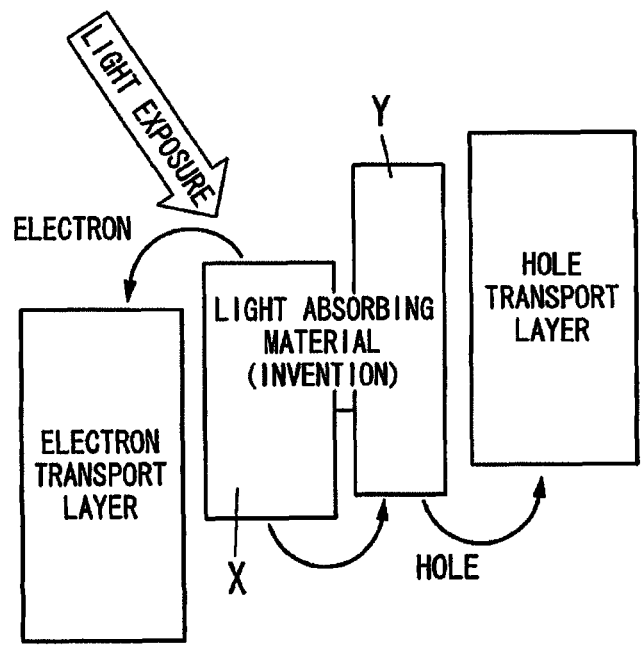
FIGS. 2(a) and 2(b) are diagrams showing the operations of the aforementioned embodiment.
Figure 2B:
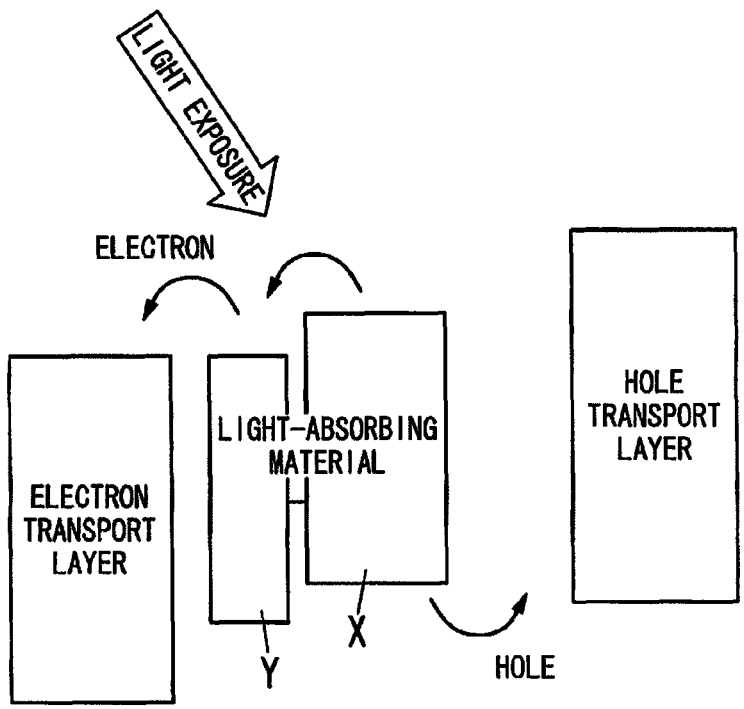
Figure 3:
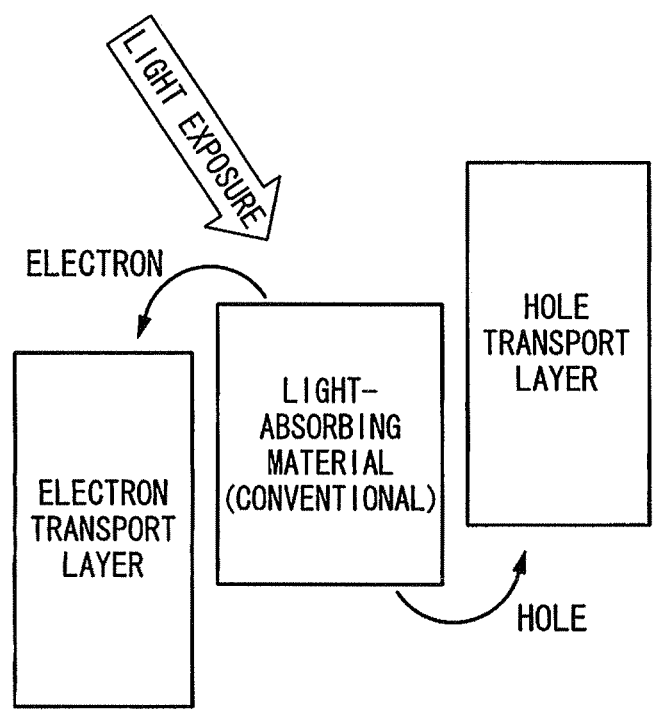
FIG. 3 is a diagram showing the operations of a conventional photoelectric conversion element.

That is, when radical site Y is an electron donor to light-absorbing site X, as shown in FIG. 2(a), holes move from the excited light-absorbing site X to radical site Y during the photoelectric conversion process that occurs when light-absorbing site X absorbs light, thereby promoting a reduction reaction of light-absorbing site X. Radical site Y is oxidized by the movement of holes to radical site Y. Next, radical site Y is reduced as holes move from radical site Y to the hole transport layer. Meanwhile, electrons move from the reduced light-absorbing site X to the electron transport layer, oxidizing light-absorbing site X. This promotes charge separation while controlling charge recombination. When radical site Y is an electron receptor for light-absorbing site X, as shown in FIG. 2(b), electrons move from the excited light-absorbing site X to radical site Y during the photoelectric conversion process that occurs when light-absorbing site X absorbs light, thereby promoting an oxidation reaction of light-absorbing site X. Radical site Y is reduced by the movement of electrons to radical site Y. Next, radical site Y is oxidized as electrons move from radical site Y to the electron transport layer. Meanwhile, holes move from the oxidized light-absorbing site X to the hole transport layer, thereby reducing light-absorbing site X. This promotes charge separation while controlling charge recombination. FIG. 3 shows a conventional example.

When undesirable radicals (—C·, —· and the like) are produced by the action of light or heat in the photoelectric conversion element, the light-absorbing material may have the same effect as a HALS (light stabilizer). In this case, the undesirable radicals are eliminated, and deterioration of the light-absorbing material is prevented. This improves the durability of the photoelectric conversion element, allowing the superior characteristics of the photoelectric conversion element to be maintained long-term.

EXAMPLES

The present invention is explained in detail below by means of examples. However, the present invention is not limited to the examples.

Examples 1 to 3

Synthesis of Light-Absorbing Material (Manufacture of Light-Absorbing Material Shown by (6))

As shown in FIG. 4, the compound represented by Structural Formula (6)-1 (30 mmol (10.2 g) 1 eq) and diethyl ether (0.2 M (150 ml)) were agitated and mixed at −78° C., tert-butyl lithium (0.27 mol (170 ml, d=1.6 M) 9 eq) was added to the resulting solution and agitated and mixed for 2 hours at −78° C. and 1 hour at room temperature, and 2-methyl-2-nitrosopropane (90 mmol (7.84 g) 3 eq) was next added to this solution and agitated and mixed for 2 hours at −78° C. and 10 hours at room temperature to obtain the compound represented by Structural Formula (6)-2 (yield 40% to 50%).

Next, as shown in FIG. 5, the compound represented by Structural Formula (6)-2 (10 mmol (3.56 g) 1 eq), DMF (0.7 M (14.3 ml)), imidazole (30 mmol (2.10 g) 3 eq) and tert-butyldimethylsilyl chloride (12.5 mol (1.88 g) 1.25 eq) were agitated and mixed for 10 hours at room temperature to obtain the compound represented by Structural Formula (6)-3 (yield 80% to 90%).

Next, as shown in FIG. 6, the compound represented by Structural Formula (6)-3 (5 mmol (2.92 g) 1 eq) and tetrahydrofuran (0.3 M (16.7 ml)) were agitated and mixed at −78° C., the compound represented by Structural Formula (6)-a (15 mol (4.11 g) 1.5 eq) was added to the resulting solution and agitated and mixed for 2 hours at −78° C. and 10 hours at room temperature, and saturated monochloramine (2 ml), diethyl ether (50 ml), tetrahydrofuran (50 ml) and 10% aqueous hydrochloric acid solution (20 ml) were further added to this solution and agitated and mixed for 10 minutes at room temperature to obtain the compound represented by Structural Formula (6)-4 (yield 50% to 60%).

Next, as shown in FIG. 7, the compound represented by Structural Formula (6)-4 (2 mmol (1.48 g) 1 eq) was mixed with the compound represented by Structural Formula (6)-b (3 mol (562 mg) 1.5 eq), tris(dibenzylidenacetone) dipalladium (0) (0.02 mol (18.0 mg) 0.01 eq), sodium tert-butoxide (3 mol (288 mg) 1.5 eq), tri tert-buylphosphine (0.06 mol (12 mg) 0.03 eq) and toluene (0.3 M (6.7 ml)), and the resulting solution was refluxed overnight to obtain the compound represented by Structural Formula (6)-5 (yield 50% to 60%).

Next, as shown in FIG. 8, the compound represented by Structural Formula (6)-5 (1 mmol (844 mg) 1 eq), the compound represented by Structural Formula (6)-c (1.1 mol (93.5 mg) 1.1 eq), ammonium acetate (0.33 mol (25.7 mg) 0.33 eq) and acetic acid (0.1M (10 ml)) were mixed, and the resulting solution was refluxed for 1 hour to obtain the compound represented by Structural Formula (6)-6 (yield 80% to 90%).

Next, as shown in FIG. 9, the compound represented by Structural Formula (6)-6 (1 mmol (911 mg) 1 eq), TBAF (20 mmol (5.23 g) 20 eq) and THF (50 mM (20 ml)) were agitated and mixed for 5 hours at room temperature in an argon atmosphere, and silver oxide (10 mol (2.31 g) 10 eq) was added to the resulting solution and agitated and mixed for 2 hours at room temperature in an argon atmosphere to obtain the compound represented by Structural Formula (6) (yield 95% to 100%).

((Manufacture of Light-Absorbing Material Represented by (7)))

As shown in FIG. 10, the compound represented by Structural Formula (7)-1 (0.1 mol (28.8 g) 1 eq), the compound represented by Structural Formula (7)-a (0.125 mol (36.4 g) 1.25 eq), potassium carbonate (0.15 mol (20.7 g) 1.5 eq) and acetone (0.7 M (142 ml)) were mixed, and the resulting solution was refluxed overnight to obtain the compound represented by Structural Formula (7)-2 (yield 95% to 100%).

Next, as shown in FIG. 11, the compound represented by Structural Formula (7)-2 (0.1 mol (45.1 g) 1 eq), the compound represented by Structural Formula (7)-b (0.04 mol (8.59 g) 0.4 eq), sodium hydroxide (0.3 mol (41.4 g) 3 eq) and acetone (0.7 M (142 ml)) were mixed, and the resulting solution was refluxed overnight to obtain the compound represented by Structural Formula (7)-3 (yield 95% to 100%).

Next, as shown in FIG. 12, the compound represented by Structural Formula (7)-3 (5 mmol (4.77 g) 1 eq) and tetrahydrofuran (0.3 M (16.7 ml)) were agitated and mixed at −78° C., the compound represented by Structural Formula (7)-c (15 mol (4.11 g) 1.5 eq) was further added to the resulting solution and mixed for 2 hours at −78° C., and this solution was agitated and mixed for 10 hours at room temperature, after which monochloramine saturated solution (2 ml), diethyl ether (50 ml), tetrahydrofuran (50 ml) and 10% aqueous hydrochloric acid solution (20 ml) were added to this solution and agitated and mixed for 10 minutes at room temperature to obtain the compound represented by Structural Formula (7)-4 (yield 50% to 60%).

Next, as shown in FIG. 13, the compound represented by Structural Formula (7)-4 (2 mmol (2.21 g) 1 eq), the compound represented by Structural Formula (7)-d (3 mol (562 mg) 1.5 eq), tris(dibenzylidenacetone) dipalladium (0) (0.02 mol (18.0 mg) 0.01 eq), sodium tert-butoxide (3 mol (288 mg) 1.5 eq), tri tert-butylphosphine (0.06 mol (12 mg) 0.03 eq) and toluene (0.3 M (6.7 ml)) were mixed, and the resulting solution was refluxed overnight to obtain the compound represented by Structural Formula (7)-5 (yield 50% to 60%).

Next, as shown in FIG. 14, the compound represented by Structural Formula (7)-5 (1 mmol (1.21 g) 1 eq), the compound represented by Structural Formula (7)-e (1.1 mol (93.5 mg) 1.1 eq), ammonium acetate (0.33 mol (25.7 mg) 0.33 eq) and acetic acid (0.1M (10 ml)) were mixed, and the resulting solution was refluxed for 3 hours to obtain the compound represented by Structural Formula (7)-6.

Next, as shown in FIG. 15, the compound represented by Structural Formula (7)-6 (1 mmol (1.28 g) 1 eq), TBAF (20 mmol (5.23 g) 20 eq) and THF (50 mM (20 ml)) were agitated and mixed for 5 hours at room temperature in an argon atmosphere, and silver oxide (10 mol (2.31 g) 10 eq) was added and agitated and mixed for 2 hours at room temperature in an argon atmosphere to obtain the compound represented by Structural Formula (7) (yield 95% to 100%).

((Manufacture of Light-Absorbing Material Represented by (8)))

As shown in FIG. 16, the compound represented by Structural Formula (8)-1 (30 mmol (9.81 g) 1 eq) and diethyl ether were agitated and mixed at −78° C., tert-butyl lithium (0.27 mol (170 ml, d=1.6 M) 9 eq) was added to the resulting solution and agitated and mixed for 2 hours at −78° C. and 1 hour at room temperature, and 2-methyl-2-nitrosopropane (90 mmol (7.84 g) 3 eq) was next added to this solution and agitated and mixed for 2 hours at −78° C., after which this solution was agitated and mixed for 1 hour at room temperature to obtain the compound represented by Structural Formula (8)-2 (yield 40% to 50%).

Next, as shown in FIG. 17, the compound represented by Structural Formula (8)-2 (10 mmol (5.72 g) 1 eq), DMF (0.7 M (14.3 ml)), imidazole (30 mmol (2.10 g) 3 eq) and tert-butyldimethylsilyl chloride (12.5 mol (1.88 g) 1.25 eq) were agitated and mixed for 10 hours at room temperature to obtain the compound represented by Structural Formula (8)-3 (yield 80% to 90%).

Next, as shown in FIG. 18, the compound represented by Structural Formula (8)-3 (10 mmol (5.72 g) 1 eq), toluene (0.7 M (14.3 ml)), sodium tert-butoxide (12.5 mol (1.20 g) 1.25 eq), copper iodide (1 mmol (0.19 g) 0.1 eq) and piperidine (1.0 mol (85 mg) 0.01 eq) were agitated and mixed, and the resulting solution was refluxed for 5 hours in an argon atmosphere to obtain the compound represented by Structural Formula (8)-A (yield 50% to 60%).

Next, as shown in FIG. 19, the compound represented by Structural Formula (8)-4 (0.1 mol (16.8 g) 1 eq), carbon tetrachloride (1M (100 ml)) and N-bromosuccinimide (0.1 mol (17.8 g) 1 eq) were agitated and mixed for 3 hours at room temperature to obtain the compound represented by Structural Formula (8)-5 (yield 50% to 60%).

Next, as shown in FIG. 20, the compound represented by Structural Formula (8)-5 (50 mmol (12.3 g) 1 eq) and dimethyl ether (0.4 M (125 ml)) were agitated and mixed at −78° C., tert-butyl lithium (125 mmol (80 ml, d=1.6 M) 2.5 eq) was added and agitated and mixed for 2 hours at −78° C., and this solution was agitated and mixed for 1 hour at room temperature, after which triisopropyl borate (75 mmol (14.1 g) 1.5 eq) was added to this solution and agitated and mixed for 2 hours at −78° C. and this solution was then agitated and mixed for 10 hours at room temperature to obtain the compound represented by Structural Formula (8)-B (yield 40% to 50%).

Next, as shown in [C32] and FIG. 21, the compound represented by Structural Formula (8)-A (2 mmol (1.45 g) 1 eq), the compound represented by Structural Formula (8)-B (3 mmol (0.873 g) 1.5 eq), toluene (0.3 M (6.7 ml)), sodium tert-butoxide (3 mol (288 mg) 1.5 eq) and tetra (triphenylphosphinato) palladium were mixed, and the resulting solution was refluxed overnight in an argon atmosphere to obtain the compound represented by Structural Formula (8)-C.

Next, as shown in FIG. 22, the compound represented by Structural Formula (8)-C (1 mmol (0.814 g) 1 eq), 2-cyanoacetic acid (1.2 mmol (0.102 g) 1.2 eq), AN (0.3 M (6.7 ml)), piperidine (0.03 mmol (2.5 mg) 0.03 eq) and tetra(triphenylphosphinato) palladium (0.01 mmol (12.6 mg) 0.01 eq) were mixed, and the resulting solution was refluxed for 5 hours in an argon atmosphere to obtain the compound represented by Structural Formula (8)-D (yield 80% to 90%).

Next, as shown in FIG. 23, the compound represented by Structural Formula (8)-D (1 mmol (909 mg) 1 eq), TBAF (20 mmol (5.23 g) 20 eq) and THF (50 mM (20 ml)) were agitated and mixed for 5 hours at room temperature in an argon atmosphere, and silver oxide (10 mol (2.31 g) 10 eq) was added to the resulting solution and agitated and mixed for 2 hours at room temperature in an argon atmosphere to obtain the compound represented by Structural Formula (8) (yield 95% to 100%).

<Preparation of Photoelectric Conversion Element (Dye-Sensitized Solar Cell)>

High-purity titanium oxide powder with an average primary particle diameter of 20 nm was dispersed in ethyl cellulose to obtain a paste for screen printing.

A 10 nm-thick titanium oxide film was formed by sputtering on a 1 mm-thick conductive glass substrate (fluorine-doped tin oxide, surface resistance 100 Ω/sq.) to prepare a first substrate electrode. The aforementioned paste for screen printing was coated on this first substrate electrode, and dried to form a dry coating. This dry coating was baked for 30 minutes in air at 500° C. A 1.5 µm-thick porous titanium oxide film was formed in this way on the first substrate electrode.

A titanium tetrachloride aqueous solution with a concentration of 0.04 mol/de was coated on this porous titanium oxide film, the porous titanium oxide film was heated for 30 minutes at 70° C., and this porous titanium oxide film was then rinsed with distilled water and air dried. An electron transport layer was thus formed on the first substrate electrode.

A dimethyl formamide solution containing the light-absorbing material represented by Structural Formula (6), a dimethyl formamide solution containing the light-absorbing material represented by Structural Formula (7), and a dimethyl formamide solution containing the light-absorbing material represented by Structural Formula (8) were each prepared. The concentration of the light-absorbing material in each solution was 0.2 mM.

The electron transport layer was immersed together with the first substrate electrode in the dimethylformamide solution containing the light-absorbing material, and the electron transport layer together with the first substrate electrode was left in this state in a dark place for 24 hours at room temperature. This electron transport layer was then washed with solvent.

A platinum film was formed by thermal reduction of chloroplatinic acid on the surface of a conductive glass substrate (Nippon Sheet Glass Company, fluorine-doped $SnO_2$, surface resistance 10 Ω/sq.) to obtain the second substrate electrode.

The first substrate electrode and second substrate electrode were arranged facing each other with the electron transport layer between the two. A seal material (hot-melt adhesive, Mitsui-DuPont Polychemical, Bynel™) was arranged between the first substrate electrode and second substrate electrode so as to surround the electron transport layer except on one side. The first substrate electrode and second substrate electrode were pressed together in this state with heat to affix the two together via the seal material.

2,2,6,6-tetramethylpiperidine-1-oxyl at a concentration of 0.01 mol/dm$^3$, lithium perchlorate at a concentration of 0.1 mol/dm$^3$, and N-methylbenzimidazole at a concentration of 0.025 mol/dm$^3$ were dissolved in acetonitrile to prepare an electrolyte solution. This electrolyte solution was injected between the first substrate electrode and second substrate electrode through the gap not blocked by the seal material. Next, the gap not blocked by the seal material was blocked with UV-curable resin. A photoelectric conversion element with a light-receiving area of 1 cm$^2$ was obtained in this way.

Comparative Example 1

Mitsubishi Paper Mills D131 dye was used instead of the light-absorbing materials represented by Structural Formulae (6) to (8). Apart from this, a photoelectric conversion element was prepared under the same conditions as in Example 1.

(Evaluation)

The current-potential characteristics of the photoelectric conversion elements were measured when the photoelectric conversion elements prepared in the examples and comparative examples were exposed to light at an intensity of 200 Lx, and the maximum output $P_{max}$ (W/cm$^2$) was derived. These results were standardized given 100 as the maximum output $P_{max}$ of Comparative Example 1, as shown in Table 1.

TABLE 1

| | Light-absorbing material | Standardized characteristics |
|---|---|---|
| Example 1 | Structural Formula (6) | 115 |
| Example 2 | Structural Formula (7) | 110 |
| Example 3 | Structural Formula (8) | 120 |
| Comparative Example | D131 | 100 |

Example 4

A first substrate electrode was prepared by forming a layer of fluorine-doped $SnO_2$ on a 1 mm-thick conductive glass substrate (Asahi Glass, surface resistance 10 Ω/sq.).

10 mg of the light-absorbing material represented by Structural Formula (14) was added and dissolved in 5 ml of N,N-dimethylformamide, and the resulting solution was applied by the drop cast method to the first substrate electrode to form a film of light-absorbing material with a thickness of 50 nm. Only the outer edge was scraped off the film of light-absorbing material on the first substrate electrode. In the part from which the film of light-absorbing material had been partly removed on the first substrate electrode, a seal material (hot melt adhesive, Dupont-Mitsui Polychemicals, Bynel™) was disposed so as to surround the remainder of the film of light-absorbing material. A hole for injection was also formed with a diamond drill, penetrating though the center of the first substrate electrode and the film of light-absorbing material.

A platinum plate was prepared as the second substrate electrode. This second substrate electrode and the first substrate electrode were arranged facing each other with the film of light-absorbing material between the two, and with the space between the two surrounded by seal material. Next, the first substrate electrode and second substrate electrode were heated and pressed to affix the two together via the seal material.

0.1 moles of 2,2,6,6-tetramethylpiperidine-1-oxyl (TEMPO) and 1.6 moles of N-methylbenzimidazole were added and dissolved in 1 ml of acetonitrile to prepare an electrolyte solution. This electrolyte solution was injected through the injection hole into the space between the second substrate electrode and the film of light-absorbing material, after which the injection hole was blocked with an UV-curable resin to obtain a photoelectric conversion element.

The open voltage of this photoelectric conversion element under light irradiation was 480 mV, and when the light was blocked the output voltage gradually converged to 0 mV. When this was again exposed to light, the open circuit voltage converged to 480 mV. This optical response behavior was stable with repeated use.

Examples 5 to 7

The light-absorbing material represented by Structural Formula (15), the light-absorbing material represented by Structural Formula (16) and the light-absorbing material represented by Structural Formula (17) were used in place of the light absorbing material represented by Structural Formula (14) in Example 5, Example 6 and Example 7, respectively. Apart from this, photoelectric conversion elements were prepared by the same methods and under the same conditions as in Example 4.

When the open voltages of these photoelectric conversion elements were measured as in Example 4, the result was 430 mV in Example 5, 410 mV in Example 6 and 380 mV in Example 7, and the optical response behavior was stable with repeated use as in Example 4.

Comparative Example 2

5 mg of Mitsubishi Paper Mills D131 dye and 5 mg of viologen were dissolved in 5 ml of N,N-dimethylformamide, and the resulting solution was applied by drop casting to a first substrate electrode to form a film 50 nm thick. No film of light-absorbing material was formed as in Example 4. A photoelectric conversion element was then prepared under the same conditions as in Example 4.

The open voltage of this photoelectric conversion element under light exposure was 90 my, and when the light was blocked the output voltage gradually converged to 0 mV. When light exposure was resumed, the open voltage converged to 90 mV. This optical response behavior was stable with repeated use.

Comparative Example 3

5 mg of Mitsubishi Paper Mills D131 dye and 5 mg of galvinoxyl were dissolved in 5 ml of N,N-dimethylformamide, and the resulting solution was applied by drop casting to a first substrate electrode to form a film 50 nm thick. No film of light-absorbing material was formed as in Example 4. A photoelectric conversion element was then prepared under the same conditions as in Example 4.

The open voltage of this photoelectric conversion element under light exposure was 40 mV, and when the light was blocked the output voltage gradually converged to 0 mV. When light exposure was resumed, the open voltage converged to 40 mV. This optical response behavior was stable with repeated use.

The invention claimed is:

1. A light-absorbing material having a structure represented by Formula (1) below:

$$X-Y \qquad (1),$$

wherein X represents a light-absorbing site, and Y represents a radical site that becomes a radical when in an oxidized state and/or when in a reduced state, and is capable of repeated oxidation-reduction,
Y in the Formula (1) is an electron acceptor for X and includes any of a bipyridinium group, a substituted bipyridinium group, a galvinoxyl radical group and a substituted galvinoxyl radical group, and
X in the Formula (1) includes a structure represented by General Formula (B) below:

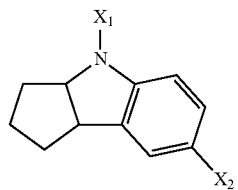

(B)

where, in the General Formula (B), $X_1$ and $X_2$ are each independently a group including at least one of an alkyl group, an alkenyl group, an aralkyl group, an aryl group and a heterocycle, and each may be substituted, and the radical site Y binds to either of $X_1$ and $X_2$.

2. A photoelectric conversion element, comprising:
the light-absorbing material according to claim 1;
an electron transport layer; and
a hole transport layer.

3. A light-absorbing material having a structure represented by Formula (1) below:

$$X-Y \qquad (1),$$

wherein X represents a light-absorbing site, and Y represents a radical site that becomes a radical when in an oxidized state and/or when in a reduced state, and is capable of repeated oxidation-reduction,
Y in the Formula (1) is an electron acceptor for X,
Y in the Formula (1) includes any of a galvinoxyl radical group and a substituted galvinoxyl radical group, and
X in the Formula (1) includes a structure represented by General Formula (C) below:

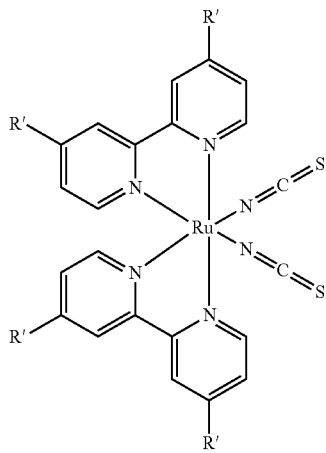

(C)

where, in the General Formula (C), each R' independently represents hydrogen or a carboxyl group, a sulfonyl group, a phenyl group, a carboxyphenyl group, a sulfophenyl group or a pyridinium group, and at least one R' substitutes for Y.

4. A photoelectric conversion element, comprising:
the light-absorbing material according to claim 3;
an electron transport layer; and
a hole transport layer.

* * * * *